(12) United States Patent
Tsuda

(10) Patent No.: US 7,936,162 B2
(45) Date of Patent: May 3, 2011

(54) MEASURED-SIGNAL REPETITION FREQUENCY DETECTION METHOD, AND SAMPLING APPARATUS AND WAVEFORM OBSERVATION SYSTEM USING THE METHOD

(75) Inventor: Yukio Tsuda, Aiko-gun (JP)

(73) Assignee: Anritsu Corporation, Atsugi-Shi (JP)

( * ) Notice: Subject to any disclaimer, the term of this patent is extended or adjusted under 35 U.S.C. 154(b) by 433 days.

(21) Appl. No.: 12/224,241

(22) PCT Filed: Jan. 23, 2008

(86) PCT No.: PCT/JP2008/050906
§ 371 (c)(1),
(2), (4) Date: Aug. 21, 2008

(87) PCT Pub. No.: WO2009/093316
PCT Pub. Date: Jul. 30, 2009

(65) Prior Publication Data
US 2010/0225302 A1    Sep. 9, 2010

(51) Int. Cl.
*G01R 23/00* (2006.01)
(52) U.S. Cl. ............... 324/76.24; 324/76.19; 324/76.39; 702/75; 702/76
(58) Field of Classification Search ................. 324/76.24
See application file for complete search history.

(56) References Cited

U.S. PATENT DOCUMENTS

| | | | | |
|---|---|---|---|---|
| 5,293,114 A | * | 3/1994 | McCormick et al. | 324/76.22 |
| 5,812,611 A | * | 9/1998 | Sogabe | 375/344 |
| 6,026,418 A | * | 2/2000 | Duncan, Jr. | 708/309 |
| 6,751,564 B2 | * | 6/2004 | Dunthorn | 702/66 |
| 2001/0012320 A1 | * | 8/2001 | Watanabe et al. | 375/226 |
| 2002/0024002 A1 | | 2/2002 | Otani et al. | |
| 2006/0155491 A1 | * | 7/2006 | Bode | 702/75 |

FOREIGN PATENT DOCUMENTS

JP    2002-71725 A    3/2002

(Continued)

OTHER PUBLICATIONS

International Preliminary Report on Patentability dated Sep. 10, 2010 (in English) in parent International Application No. PCT/JP2008/050906.
English language International Search Report dated Apr. 1, 2008, issued in counterpart International Application No. PCT/JP2008/050906.

*Primary Examiner* — Timothy J Dole
*Assistant Examiner* — John Zhu
(74) *Attorney, Agent, or Firm* — Holtz, Holtz, Goodman & Chick, PC

(57) ABSTRACT

In a method of detecting a repetition frequency of a measured signal, in order to detect the waveform repetition frequency of the measured signal with high accuracy even in the presence of a frequency fluctuation in the measured signal, the repetition frequency of the measured signal acquired by the conventional method is used as a provisional repetition frequency, and the frequency change amount of the specified signal obtained in the case where the measured signal is sampled sequentially with a sampling frequency greatly changed from the provisional sampling frequency to generate a frequency fold at the time of sampling is detected. Based on the detected frequency change amount of the specified signal and the change amount of the sample number indicating how many times the frequency fold has occurred in the process, the error contained in the sampling number with a frequency fluctuation contained in the measured signal is calculated. Then, based on the error contained in this sample number, the provisional repetition frequency of the measured signal is corrected, thereby calculating the regular repetition frequency of the measured signal.

22 Claims, 13 Drawing Sheets

FOREIGN PATENT DOCUMENTS

| | | |
|---|---|---|
| JP | 2004-28960 A | 1/2004 |
| JP | 2006-3326 A | 1/2006 |
| JP | 2006-003327 A | 1/2006 |
| JP | 2007-10411 A | 1/2007 |

* cited by examiner

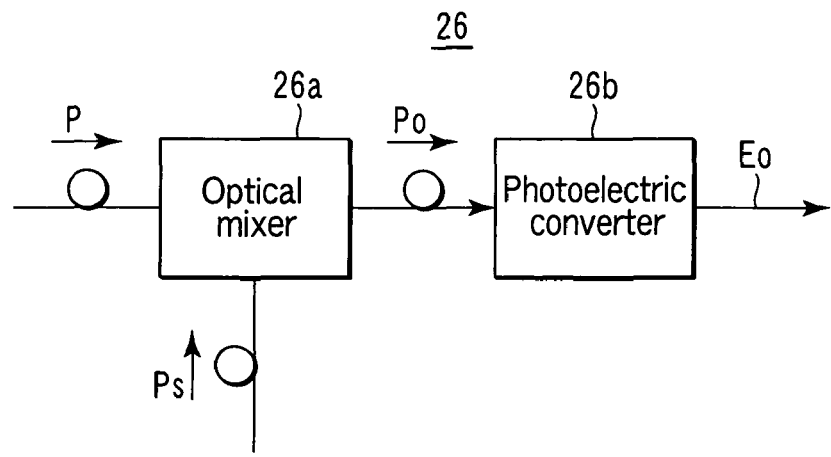
F I G. 7
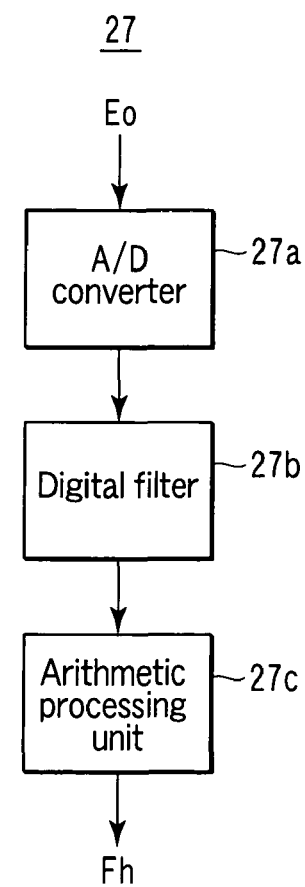
F I G. 8

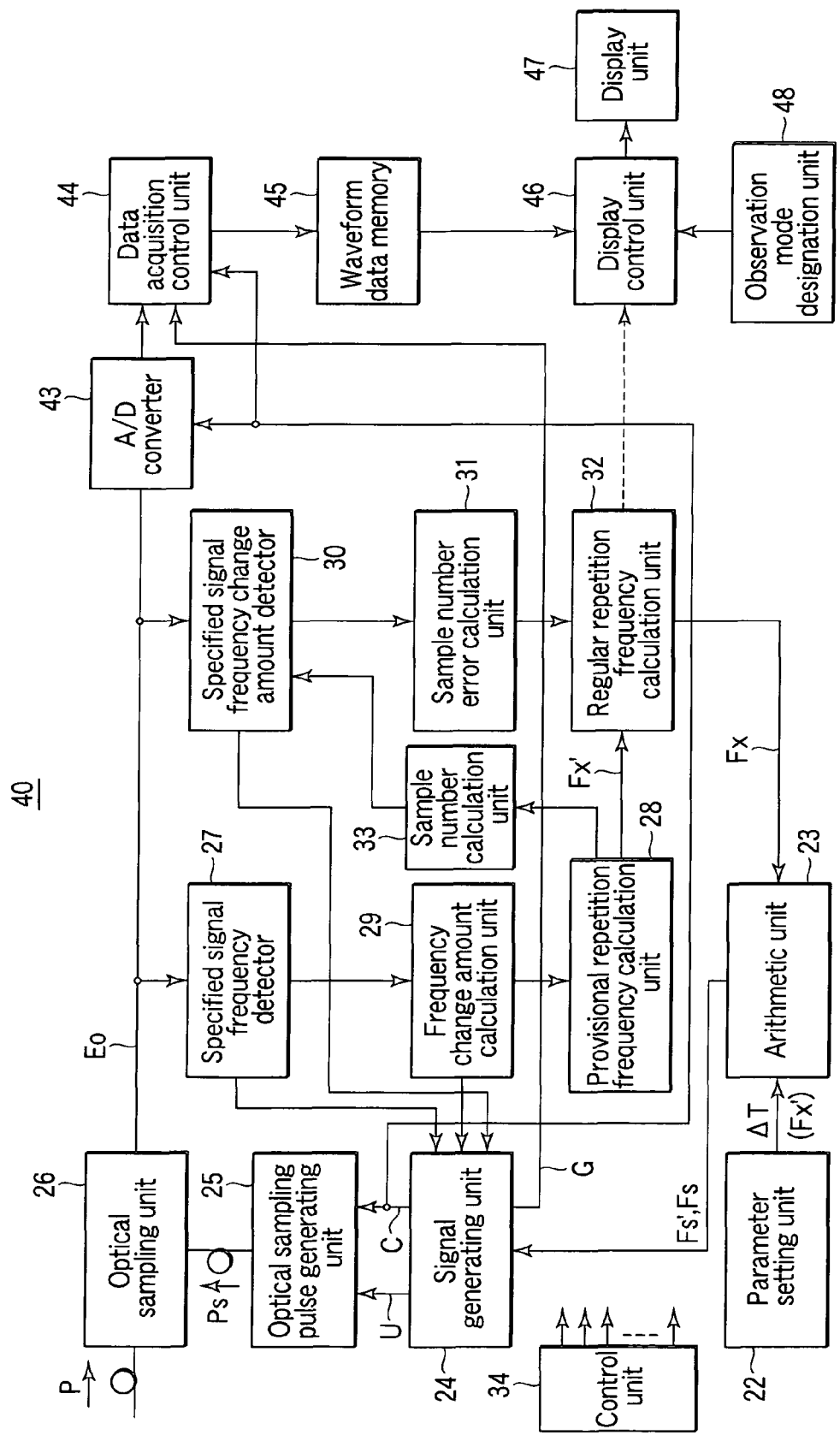
F I G. 9

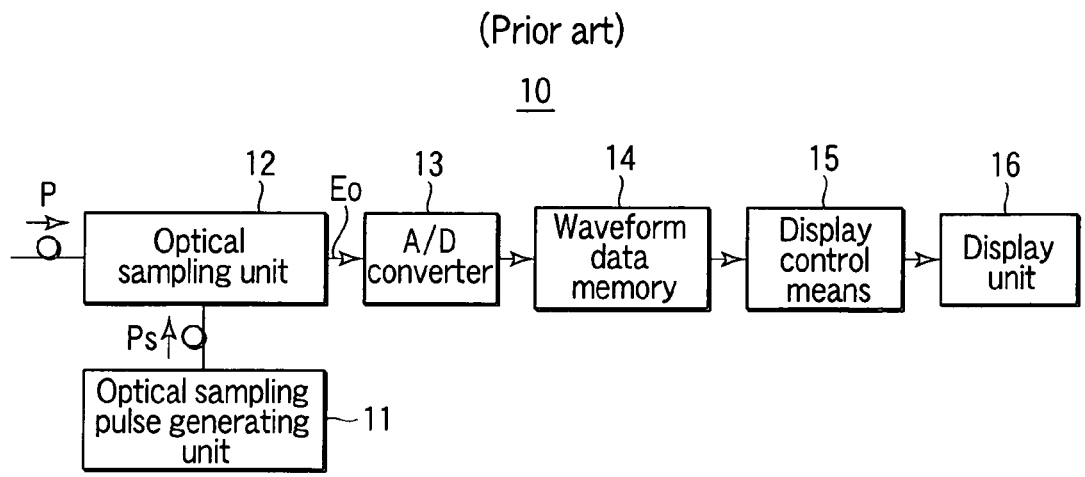
F I G. 10
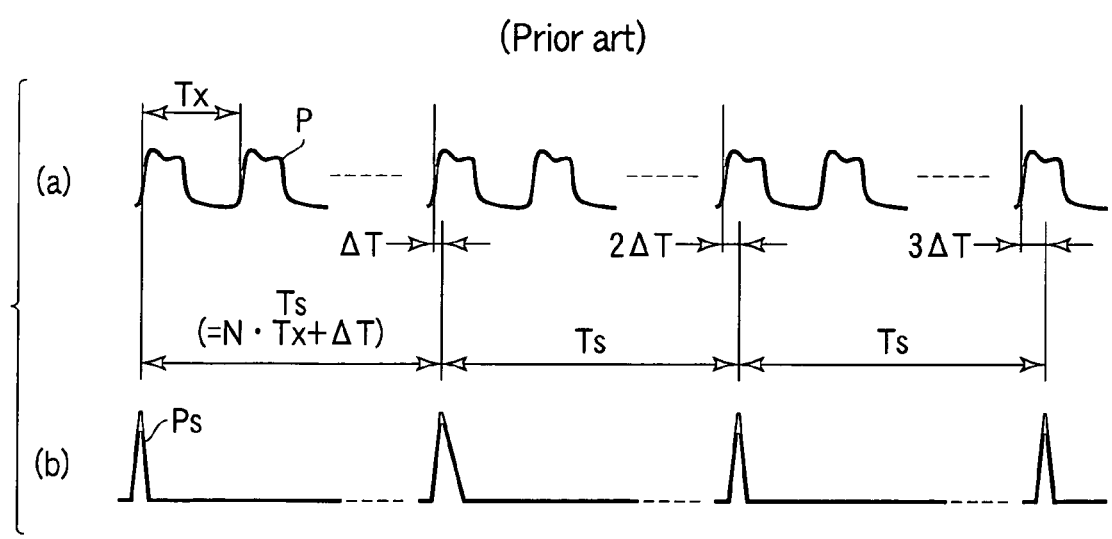
F I G. 11

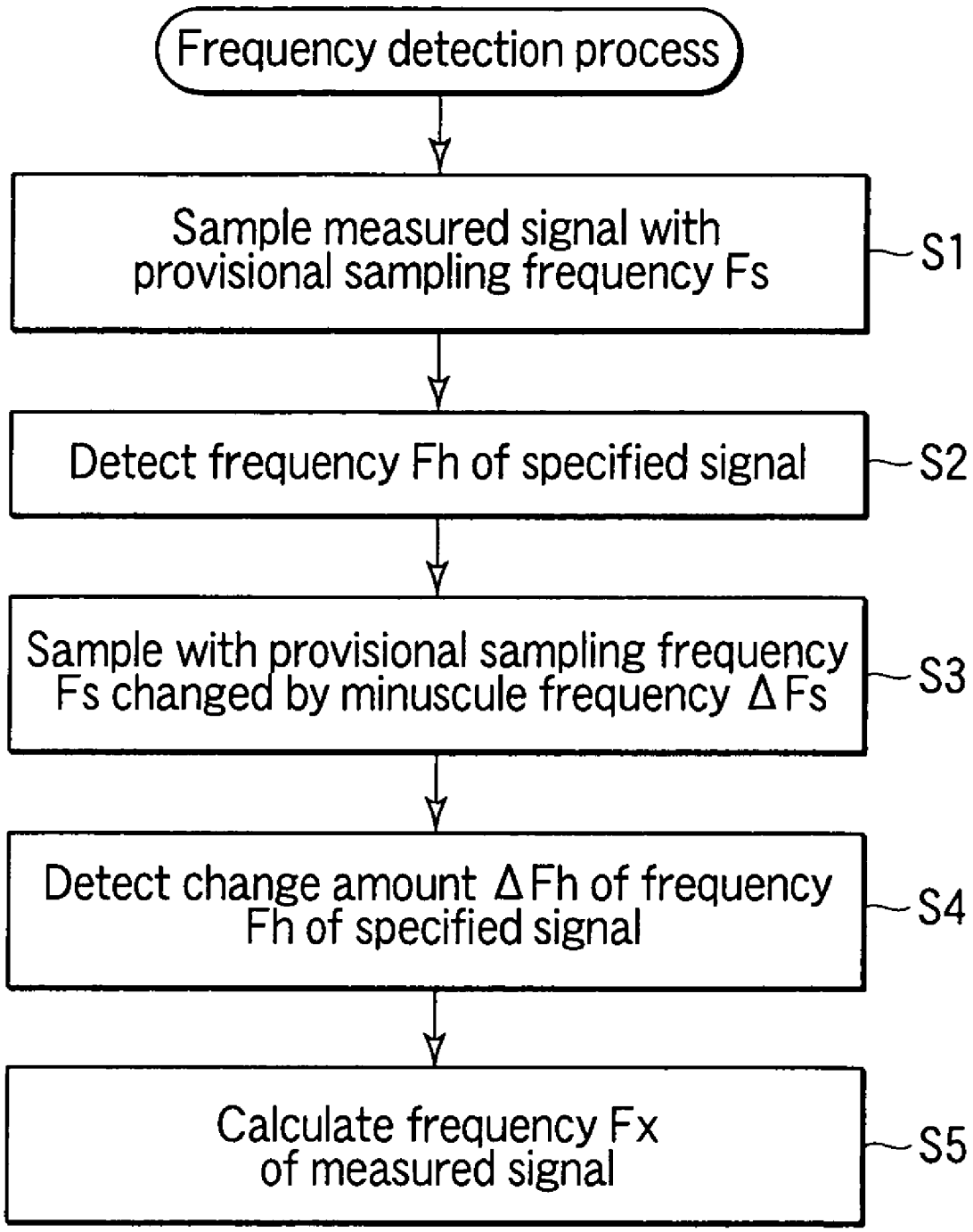
F I G. 14

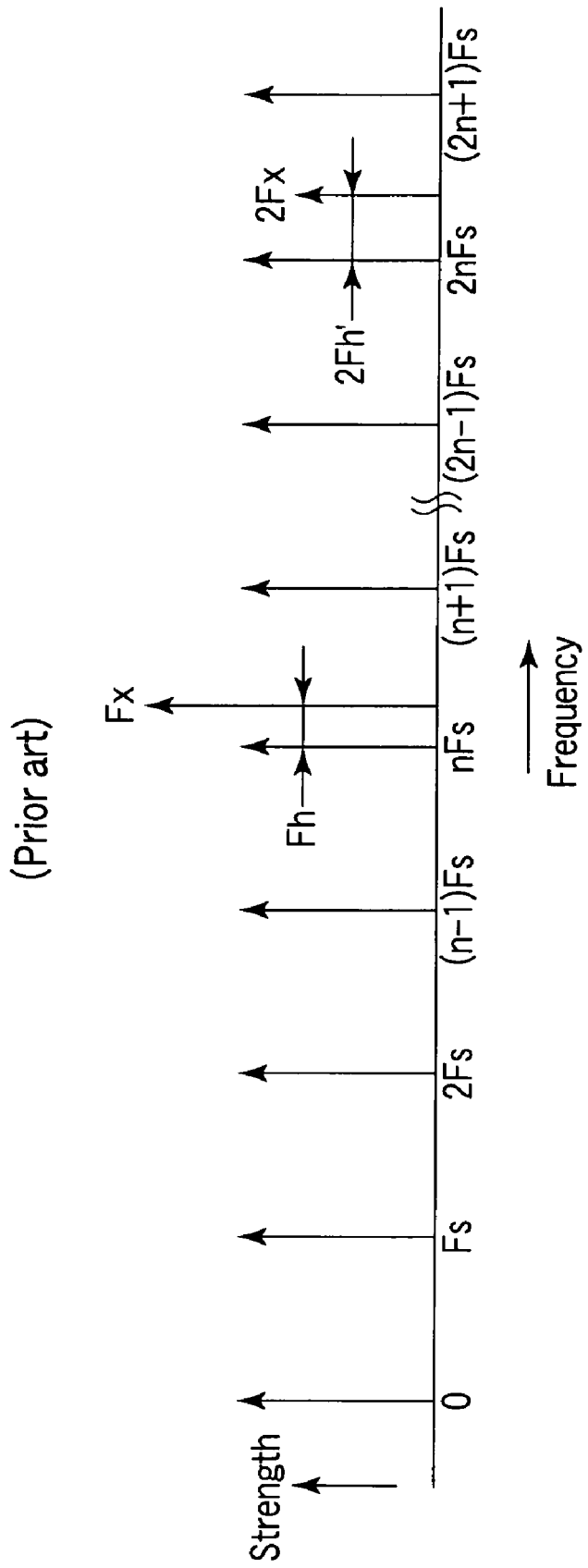
F I G. 17

(Prior art)
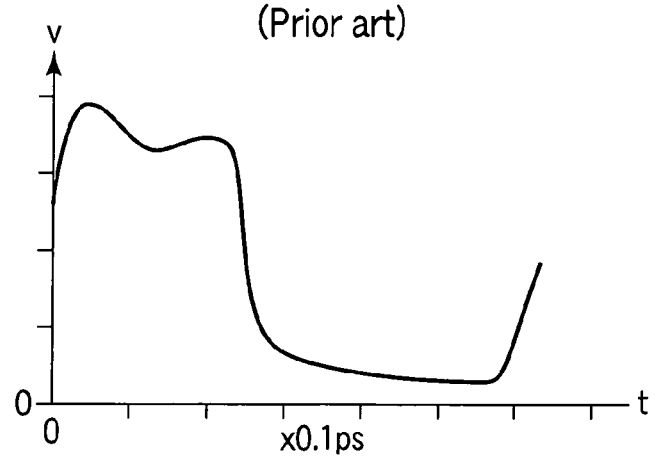
F I G. 19

MEASURED-SIGNAL REPETITION FREQUENCY DETECTION METHOD, AND SAMPLING APPARATUS AND WAVEFORM OBSERVATION SYSTEM USING THE METHOD

This application is a U.S. National Phase Application under 35 USC 371 of International Application PCT/JP2008/050906 filed Jan. 23, 2008.

TECHNICAL FIELD

The present invention relates to a method for detecting a repetition frequency of a measured signal and a sampling apparatus and a waveform observation system using the method, and in particular, to a measured-signal repetition frequency detection method and a sampling apparatus and a waveform observation system using the method, in which an optical signal modulated by a high-speed repetitive signal is sampled thereby to acquire and observe the waveform information thereof, and in which a technique is employed to acquire and observe stable waveform information by accurately detecting the frequency of the measured signal even in the presence of a frequency fluctuation of the measured signal.

BACKGROUND ART

In order to acquire and observe the waveform data of the optical signal modulated by a high-speed repetitive signal, for example, a waveform observation device 10 shown in FIG. 10 is used.

In this waveform observation device 10, an optical sampling pulse Ps having a narrow pulse width and a repetitive period Ts (=N·Tx+ΔT) longer by a predetermined value (offset delay time) ΔT than a value N times (N is an arbitrary integer not less than 1 such as 100 or 1000) of the repetitive period Tx of the waveform of an input measured optical signal P is generated by optical sampling pulse generating means 11.

The optical sampling pulse Ps generated by the optical sampling pulse generating means 11 is input to an optical sampling unit 12 together with the measured optical signal P.

In this optical sampling unit 12, the pulse light obtained by sampling the measured optical signal P by the optical sampling pulse Ps is subjected to photoelectric conversion into an electrical pulse signal Eo and output to an analog/digital (A/D) converter 13.

This A/D converter 13 converts the amplitude strength of the electrical pulse signal Eo into digital data and causes to store it in a waveform data memory 14.

A series of waveform data stored in this waveform data memory 14, after being read by display control means 15, is displayed as a waveform of the measured optical signal P on a display unit 16.

In the waveform observation device 10 of thus sampling scheme, as shown in (a) of FIG. 11, the sampling timing by the optical sampling pulse Ps is shifted ΔT time as shown in (b) of FIG. 11 each time the repetitive waveform of the measured optical signal P is input N times continuously. Therefore, a series of the waveform data, obtained by sampling the waveform of the measured optical signal P with a high resolution at a remarkably low sampling rate as compared with the period Tx, can be observed on the screen of the display unit 16.

Thus sampling scheme waveform observation device 10 is disclosed, for example, in Patent Document 1 described below.

The observation modes required of this waveform observation device 10 include a persistence mode and an averaging mode.

The persistence mode is the one in which the operation is repeated to sample the measured optical signal P and display the acquired data on the screen of a display unit for a predetermined time so that the measurement waveform is displayed based on the incidental image thereof, and the change in the waveform of the measured optical signal can be observed substantially in real time.

The averaging mode, on the other hand, is the one in which the measured optical signal P is sampled and the waveform data acquired for a plurality of data acquisition periods are averaged out and the averaged waveform is displayed. This mode makes possible the waveform observation with noise components removed.

Unless the operation of sampling the measured optical signal P is started from the same phase position of the repetitive waveform thereof, the waveform displayed is inconveniently displaced each time along the time axis in the observation mode in which the waveform of the measured optical signal is displayed by the incidental image thereof.

Also, in the averaging mode, the averaging process cannot be correctly executed and the waveform cannot be correctly reproduced, while at the same time making it impossible to correctly grasp the waveform phase and the size of the amplitude variation.

For this reason, the repetitive period of the waveform of the measured signal or the frequency (bit rate) of the signal itself is required to be known in advance.

In some cases where the correct value, not the approximate value, of the repetitive period of the waveform or the frequency of the measured signal to be observed is unknown, however, the correct sampling period cannot be set for the waveform of the measured signal to be observed, thereby posing the problem that the waveform cannot be observed as desired.

Also, in this type of the waveform observation device, an optical mixer or the like for generating the optical sampling pulse having a narrow width or mixing the light with each other is required, thereby posing another problem that the whole device including the display unit is complicated and increased in cost.

In view of this, the present inventor, in order to solve this problem, has proposed a repetition frequency detection method of a measured signal as disclosed in Patent Document 2 described later as a prior application in Japan.

Next, the principle of the measured-signal repetition frequency detection method disclosed in Patent Document 2 will be explained.

For the present purpose, the measured signal is assumed to be a sinusoidal wave of a single frequency Fx, and the frequency component of the signal Sx obtained by sampling this signal with a provisional sampling frequency Fs is studied.

In the case where the sampling pulse is an ideal one having an infinitely small width, the frequency component thereof has each spectrum of frequency n·Fs as shown in FIG. 12 (n=0, 1, 2, . . . ).

The signal Sx obtained by sampling using this sampling pulse, therefore, contains components including the difference and the sum between the frequency Fx of the measured signal and each frequency n·Fs.

Among these components, the one having the lowest frequency, as shown in (a) and (b) of FIG. 13, is the difference frequency with the spectrum component of the frequency n·Fs nearest to the frequency Fx or the difference frequency with the spectrum component of the frequency $(n+1)\cdot Fs$. This difference frequency Fh can be expressed as follows:

$Fh=\mathrm{mod}[Fx, Fs]$ ... (in the case where mod $[Fx, Fs] \leq Fs/2$)

$Fh=(Fs/2)-\mathrm{mod}[Fx, Fs]$ ... (in the case where mod $[Fx, Fs] > Fs/2$)

where the symbol mod[A, B] indicates the remainder after dividing A by B.

This difference frequency Fh is Fs/2 at maximum, and therefore, can be easily extracted by use of a low-pass filter having the upper limit band of Fs/2.

Now, the change δFh in the difference frequency Fh due to a minuscule change δFs of the sampling frequency Fs is given by the following equation obtained by differentiating the difference frequency Fh with the frequency Fs.

$\delta Fh/\delta Fs = -\mathrm{quotient}[Fx, Fs]$ ... (in the case where $0<\mathrm{mod}[Fx, Fs]<Fs/2$)

$\delta Fh/\delta Fs = 1+\mathrm{quotient}[Fx, Fs]$ ... (in the case where $\mathrm{mod}[Fx, Fs]>Fs/2$)

where the symbol quotient[A, B] indicates an integral quotient obtained by dividing A by B.

From this result and the relation $\mathrm{mod}[Fx, Fs]=Fx-Fs\cdot\mathrm{quotient}[Fx, Fs]$ between the quotient and the remainder, the frequency Fx of the measured signal can be determined from the following arithmetic operation.

$Fx=Fh-Fs\cdot\delta Fh/\delta Fs$ ... (in the case where $0>\delta Fh$)

$Fx=-Fh+Fs\cdot\delta Fh/\delta Fs$ ... (in the case where $0<\delta Fh$)

FIG. 14 is a flowchart showing an example of the steps of the repetition frequency detection method of the measured signal described above.

First, the measured signal is sampled with a provisional sampling frequency Fs (step S1), and among the signals obtained by this sampling, the frequency Fh of a specified signal appearing in the band not more than one half of the sampling frequency Fs is detected (step S2).

Then, the sampling frequency is changed by a minuscule amount ΔFs (for example, 1 Hz) (step S3), and the corresponding frequency change amount ΔFh of the specified signal is detected (step S4).

Then, the sampling frequency Fs with the frequency change amount ΔFs thereof and the frequency Fh of the specified signal with the frequency change amount ΔFh thereof are substituted into Equation (1) below thereby to calculate the repetition frequency Fx of the measured signal (step S5).

$Fx=Fh-Fs\cdot\Delta Fh/\Delta Fs$ ... (in the case where $0>\Delta Fh$)

$Fx=-Fh+Fs\cdot\Delta Fh/\Delta Fs$ ... (in the case where $0<\Delta Fh$)  (1)

As a result, in the case of a system for acquiring and observing the waveform information, the waveform information of the measured signal can be acquired and observed accurately by executing the aforementioned frequency detection process for the measured signal and setting a sampling frequency Fs corresponding to the frequency Fx obtained thereby.

Now, the error contained in the detected repetition frequency described above is studied. The definition above shows that the value δFh/δFs is an integer, and therefore, in the case where the value ΔFh/ΔFs obtained by actual measurement is not an integer, the measurement error can be eliminated by rounding off the fractions of the value to the nearest integer.

Also, since the sampling frequency is a value given by the system itself, no error is generated.

Further, the measurement error of the frequency Fh of a specified signal is determined by the resolution of the digital signal processing such as the fast Fourier transform (FFT) and can be reduced easily to several Hz or less.

These facts indicate that the calculation error of the repetition frequency Fx of the measured signal can also be reduced to the accuracy of not more than several Hz.

This error is, for example, $10^{-10}$ for the repetition frequency of 10 GHz. Thus, the repetition frequency of the measured signal can be detected with a very high accuracy.

Furthermore, the foregoing description is based on the assumption that the measured signal is a sinusoidal wave of a single frequency Fx, and the measured signal to be actually observed normally contains a plurality of frequency components.

Specifically, in the case where the measured signal is a signal modulated by the data according to the non-return to zero (NRZ) scheme, a multiplicity of frequency components Fx(i) may exist down to the lower frequency limit corresponding to the period (waveform repetition period) equal to the code length of the particular modulated data, and the level of each frequency component depends on the pattern of the modulated data.

In the case where the modulated data is a 2-bit data (10) of 10 Gbps, for example, the frequency component of 5 GHz one half of the bit rate and a harmonic component thereof exist so that the frequency component one half of the bit rate is highest in level.

In the case where the modulated data is a 10-bit data (1111100000) of 10 Gbps, on the other hand, the frequency component of 1 GHz one tenth of the bit rate and a harmonic component thereof exist, and the frequency component of 1 GHz one tenth of the bit rate is highest in level.

Also, in the case of a pattern which is not so simple that the periods of 1 and 0 of the same length alternately appear with the duty factor of 50% as described above but in which the periods of 1 and 0 appear a plurality of times within one code such as (1100011100), the level of the frequency component of 2 GHz one fifth of the bit rate is higher than that of the frequency component one half of the bit rate or the frequency component corresponding to the period equal to the code length.

As described above, the frequency of a specified signal with a frequency component higher in level, though not coincident with the repetition frequency of the signal waveform, is detected more advantageously from the viewpoint of S/N and the repetition frequency is determined more advantageously with a higher accuracy from the frequency of this specified signal.

Also, Patent Document 2 discloses a waveform observation system including a sampling apparatus using the measured-signal repetition frequency detection method described above.

FIG. 15 shows the configuration of a waveform observation system 20 including the sampling apparatus using the measured-signal repetition frequency detection method described above.

This waveform observation system 20 is configured of a sampling apparatus 21 and a digital oscilloscope 60.

In the sampling apparatus 21, the measured optical signal P input from an input terminal 21a is sampled by an optical sampling unit 26 with a sampling pulse making up an optical pulse having a narrow width generated from a sampling pulse generating unit 24 based on the clock signal C by the signal generating unit 24 thereby to acquire a pulse signal Eo as the waveform information thereof.

The digital oscilloscope 60 stores and displays the waveform information obtained by the sampling apparatus 21.

This sampling apparatus 21 has the manual setting mode designated in the case where the repetition period of the waveform to be observed is accurately known and the auto setting mode designated in the case where the repetition period of the waveform to be observed is unknown or only approximately known. The manual setting mode or the auto setting mode can be selectively designated by the operation of an operating unit (not shown).

Furthermore, the clock signal C and the trigger signal G generated by the signal generating unit 24 can be output outside through a clock output terminal 21*b* and a trigger output terminal 21*d*, respectively.

In similar manner, the pulse signal Eo from the optical sampling unit 26 is adapted to be output outside through a sample signal output terminal 21*c*.

These output terminals 21*b* to 21*d* of the sampling apparatus 21 are connected to an external clock input terminal 60*a*, a first channel input terminal 60*b* and a second channel input terminal 60*c*, respectively, of the digital oscilloscope 60.

The digital oscilloscope 60 has the external clock synchronization function to execute the A/D conversion process of the signal input from the channel input terminals 60*b*, 60*c* in synchronism with the clock signal input to the external clock input terminal 60*a*, the external trigger function to store, as waveform data for each channel, the data obtained by the A/D conversion process during the lapse of a predetermined time (depending on the display width, the number of display points, etc. along the time axis described later) from the timing when the voltage of the input signal to an arbitrary designated input terminal or the trigger input terminal has exceeded an arbitrarily set threshold value in a predetermined direction, and the waveform display function to display the stored waveform data on the time axis. As this waveform display mode, any one of the persistence display mode and the averaging display mode described above can be selected as desired.

Next, the operation of the waveform observation system 20 described above will be explained.

First, as shown in (a) of FIG. 16, for example, a measured optical signal P of a substantially rectangular wave having the duty factor of 50% is input to the input terminal 21*a*, and the information corresponding to the approximate repetition period Tx' (frequency Fx') and the sampling offset delay time ΔT is designated by a parameter designation unit 22 while at the same time designating the auto setting mode through the operating unit (not shown).

The arithmetic unit 23, based on the designated approximate repetition frequency Fx' and the offset delay time ΔT, calculates the provisional sampling frequency Fs' and the trigger frequency Fg', which are then set in the signal generating unit 24.

Furthermore, in the case where the auto setting mode is designated without designating the repetition frequency Tx', the arithmetic unit 23 performs the arithmetic operation with a specified value such as 10 GMHz as the repetition frequency Fx'.

As a result, the clock signal C having the provisional sampling frequency Fs' is output from the signal generating unit 24.

In the optical sampling unit 26, the measured optical signal P is sampled at the sampling frequency Fs', and the pulse signal Eo obtained by this sampling is input to a specified signal frequency detector 27.

The specified signal frequency detector 27 detects, among the frequency components contained in the pulse signal Eo obtained by the sampling operation thereof, the frequency Fh' of a specified signal made up of the highest frequency component appearing in the band of not more than one half of the sampling frequency.

In the case of the waveform of this optical signal, the spectrum of the optical sampling pulse Ps used for sampling appears at intervals of the frequency Fs' as shown in FIG. 17, while the spectrum of the waveform of the optical signal S appears at intervals of the frequency Fx. In addition, the spectrum of the higher-order appears in the lower-level.

In the specified signal frequency detector 27, therefore, the difference frequency Fh' between the lowest-order frequency Fx and the sampling frequency component n·Fs' nearest to the frequency Fx is determined as the frequency of the specified signal and output to a repetition frequency calculation unit 28.

The frequency Fh' of the specified signal for the provisional sampling frequency Fs', once acquired as described above, is stored in the repetition frequency calculation unit 28 which in turn instructs the signal generating unit 24 to change the sampling frequency by a minuscule amount (for example, 1 Hz).

In response to this instruction, the signal generating unit 24 changes the provisional sampling frequency for the measured optical signal P by a minuscule amount ΔFs. With this change, the frequency of the specified signal detected by the specified signal frequency detector 27 is changed by ΔFh. From this change amount, the repetition frequency Fx of the waveform of the measured optical signal P is calculated according to the equation described below and set in the arithmetic unit 23.

$$Fx=Fh'-Fs'\cdot \Delta Fh/\Delta Fs'$$

The arithmetic unit 23, based on the accurate repetition frequency Fx calculated by the repetition frequency calculation unit 28, calculates the regular sampling frequency Fs and the trigger frequency Fg in exact correspondence with the input signal, and sets the result in the signal generating unit 24.

As a result, the clock signal C and the optical sampling pulse Ps having a period equal to N·Tx+ΔT for the repetition period Tx of the waveform of the measured optical signal P are generated as shown in (b) and (c) of FIG. 16.

Then, the measured optical signal P is sampled by the optical sampling pulse Ps, and the pulse signal Eo obtained by this sampling is input to the first channel input terminal 60*b* of the digital oscilloscope 60 through the sample signal output terminal 21*c* from the optical sampling unit 26 as shown in (d) of FIG. 16.

Also, a trigger signal G having a period equal to the period of the waveform of the envelope connecting the peaks of the pulse signal Eo as shown in (b) of FIG. 18 is generated from the signal generating unit 24, and through the trigger output terminal 21*d*, input to the second channel input terminal 60*c* of the digital oscilloscope 60.

Furthermore, (a) of FIG. 18 shows the time axis, in compressed form, of the waveform shown in (d) of FIG. 16.

The digital oscilloscope 60 executes the A/D conversion process for the pulse signal Eo in synchronism with the clock signal C, and the data on the envelope connecting the peak points of the pulse signal Eo are sequentially output as optical signal waveform data, and from the timing when the trigger signal G exceeds the trigger level in a predetermined direction, begins to acquire the waveform data thereof.

As shown in FIG. 19, therefore, the waveform of the measured optical signal P is displayed as an incidental image at points with the intervals of the offset delay time $\Delta T$ on the screen of the digital oscilloscope 60.

In the digital oscilloscope 60 which begins to acquire the waveform data at each timing when the trigger signal G exceeds the trigger level in a predetermined direction and displays an updated waveform, the sampling frequency and the trigger frequency of the sampling apparatus 20 accurately correspond to the repetition frequency of the waveform of the input optical signal P as described above, and therefore, an always-stable waveform observation is made possible without any displacement of the waveform display position.

The foregoing description represents a case in which the waveform to be observed is a rectangular wave having the duty factor of 50% and the lowest-order specified signal is at maximum level.

In the case where the waveform of 10 bits of the NRZ data (1100011100) is repeated at the bit rate of 10 Gbps, for example, the repetition frequency Fx thereof is 10/10=1 GHz. Taking the level of each frequency component contained in the waveform into consideration, however, the component of 10/2=2 GHz which is twice as high as the 1-GHz component is larger.

This is also the case with the signal contained in the pulse signal Eo, and as described above, the frequency component of the lowest-order specified signal for the repetition frequency Fx equivalent to one waveform period is so low in level that the frequency may not be calculated accurately.

Even in such a case, the specified signal frequency detector 27 selects the signal component of the highest level as a specified signal among the signal components within the band of not more than one half of the sampling frequency, and detects the frequency thereof. Thus, no accuracy reduction occurs.

Patent Document 1: Jpn. Pat. Appln. KOKAI Publication No. 2002-071725

Patent Document 2: Jpn. Pat. Appln. KOKAI Publication No. 2006-3327

DISCLOSURE OF INVENTION

Specifically, the measured-signal repetition frequency detection method disclosed in the above-mentioned Patent Document 2 is, in short, a method in which among the signals obtained by sampling the measured signal at a given repetition frequency Fs, the frequency Fh of the specified signal appearing in the band of not more than Fs/2 is measured, and then the sampling is carried out with the sampling frequency changed by a minuscule frequency $\Delta Fs$, in which case the frequency change amount $\Delta Fh$ of the specified signal obtained is measured and the repetition frequency Fx of the measured signal is determined from the following equations:

$Fx=Fh-Fs\cdot\Delta Fh/\Delta Fs$ ... (in the case where $0>\Delta Fh/\Delta Fs$)

$Fx=-Fh+Fs\cdot\Delta Fh/\Delta Fs$ ... (in the case where $0<\Delta Fh/\Delta Fs$)

However, the measured-signal repetition frequency detection method disclosed in Patent Document 2 has the following problem to be solved.

Specifically, in the presence of a frequency fluctuation in the measured signal, the result of measurement of the repetition frequency of the measured signal is caused to have a large error.

An explanation will be given below about the cause of the large error which occurs in the measurement result of the repetition frequency of the measured signal due to the frequency fluctuation existing in the measured signal.

In the equations for determining the repetition frequency of the measured signal described above, $\Delta Fh/\Delta Fs$ (sample number n) indicates the number of order of the harmonic component nearest to Fx, and in the measured-signal repetition frequency detection method disclosed in Patent Document 2 above, the sampling frequency is changed by a minuscule amount within the range not changing the sample number n (not generating the frequency fold by sampling).

In the case where the frequency of the measured signal fluctuates (relatively), however, the value Fx is changed by the frequency fluctuation amount $\Delta Fx$ while the sampling frequency undergoes a change.

This frequency fluctuation amount $\Delta Fx$ is directly added to the frequency change amount $\Delta Fh$ of the specified signal measured, thereby generating a large error in the measurement result of the repetition frequency detection of the measured signal.

In the calculation of the sample number n, the measurement error contained in $\Delta Fh$ can be ignored normally by rounding off the fractions of the calculation result of $\Delta Fh/\Delta Fs$ as described above.

In the case where $|\Delta Fs/2|<|\Delta Fx|$, however, this cannot be ignored, resulting in a measurement error.

If n is wrong by one, the Fx calculation result assumes a value different by Fs, resulting in a very large measurement error.

Next, the reason why the measurement accuracy cannot be simply improved will be explained.

Generally, $\Delta Fh$ may be accurately measured by lengthening the measurement time and thus improving the resolution of the spectrum analysis.

A lengthened measurement time, however, would increase the frequency fluctuation amount of the measured signal, and therefore, produces no effect of improving the resolution of the spectrum analysis.

Also, in the calculation of the sample number n according to the calculation formula of $\Delta Fh/\Delta Fs$, the tolerance of the error contained in the numerator $\Delta Fh$ can be increased by increasing the denominator $\Delta Fs$. With the increase in the denominator $\Delta Fs$, however, a frequency fold occurs and n would assume different values before and after the change in the sampling frequency, thereby making it impossible to calculate the sample number n from the calculation formula $\Delta Fh/\Delta Fs$.

In the calculation of the sample number n by the calculation formula $\Delta Fh/\Delta Fs$, therefore, the denominator $\Delta Fs$ cannot be increased greatly, and therefore, the tolerance of the error contained in the numerator $\Delta Fh$ cannot be greatly increased either.

In the measured-signal repetition frequency detection method and the sampling apparatus and the waveform observation system using the method disclosed in Patent Document 2 described above, therefore, the presence of a frequency fluctuation in the measured signal would make it impossible to accurately detect the frequency of the signal from the sampling result. This in turn poses the problem that the waveform information cannot be stably acquired and observed while at the same time making it impossible to configure the whole system simply.

An object of the invention is to solve these problems and provide a method of detecting the repetition frequency of a measured signal whereby the frequency of the signal can be accurately detected from the sampling result even in the presence of a frequency fluctuation in the measured signal, and a sampling apparatus and a waveform observation system using the method whereby the waveform information can be stably acquired and observed while at the same time making it possible to easily simplify the system as a whole.

In order to achieve the above-described object, according to a first aspect of the present invention, there is provided a measured-signal repetition frequency detection method comprising:

a first stage (S11, S12) for detecting a frequency Fh of a specified signal appearing in a band not more than one half of a provisional sampling frequency Fs among signals obtained by sampling a measured signal with the provisional sampling frequency Fs;

a second stage (S13, S14) for calculating a frequency change amount ΔFh of the specified signal obtained with a sampling frequency changed from the provisional sampling frequency Fs by a minuscule frequency ΔFs not generating a frequency fold at a time of sampling;

a third stage (S15) for calculating a sample number n from Equation (1):

$$n = \Delta Fh/\Delta Fs \quad (1)$$

where a denominator is the minuscule frequency ΔFs in the second stage (S13, S14) and a numerator is the frequency change amount ΔFh of the specified signal in the second stage (S13, S14);

a fourth stage (S16) for calculating a provisional repetition frequency Fx' of the measured signal based on the provisional sampling frequency Fs, the frequency Fh of the specified signal for the provisional sampling frequency Fs, the minuscule frequency ΔFs as a change amount of the sampling frequency and the frequency change amount ΔFh of the specified signal;

a fifth stage (S17, S18, S19) for detecting a frequency change amount dFh_meas of the specified signal obtained in the case where the measured signal is sampled with a sampling frequency changed greatly from the provisional sampling frequency Fs so as to generate the frequency fold at a time of sampling and calculating an error en contained in the sample number n calculated in the third stage (S15) with a frequency fluctuation contained in the measured signal, based on a detected frequency change amount dFh_meas of the specified signal and a change amount dn of the sample number n calculated in the third stage (S15) indicating how many times the frequency fold has occurred in this process; and a sixth stage (S20) for calculating a regular repetition frequency Fx of the measured signal by correcting the provisional repetition frequency Fx' of the measured signal calculated in the fourth stage (S16) based on the error en contained in the sample number n calculated in the fifth stage (S17, S18, S19).

In order to achieve the above-described object, according to a second aspect of the present invention, there is provided the measured-signal repetition frequency detection method according to the first aspect, wherein the first stage (S11, S12) is such that among the signals obtained by sampling the measured signal with the sampling frequency having a given repetition frequency Fs as the provisional sampling frequency, a frequency Fh of the signal indicating a maximum level is measured as the specified signal appearing in a band not more than one half of the given repetition frequency Fs.

In order to achieve the above-described object, according to a third aspect of the present invention, there is provided the measured-signal repetition frequency detection method according to the second aspect, wherein the fourth stage (S16) is such that the provisional repetition frequency Fx' of the measured signal is calculated from Equation (2):

$$Fx' = Fh - Fs \cdot \Delta Fh/\Delta Fs \ldots \text{(in the case where } 0 > \Delta Fh/\Delta Fs)$$

$$Fx' = -Fh + Fs \cdot \Delta Fh/\Delta Fs \ldots \text{(in the case where } 0 < \Delta Fh/\Delta Fs) \quad (2)$$

based on the frequency Fh of the signal indicating the maximum level as the specified signal appearing in the band Fs/2 not more than one half of the given repetition frequency Fs detected in the first stage (S11, S12) and the frequency change amount ΔFh of the specified signal obtained in the case where the measured signal is sampled with the given repetition frequency Fs changed by the minuscule frequency ΔFs not generating the frequency fold at a time of sampling as the provisional sampling frequency measured in the second stage (S13, S14).

In order to achieve the above-described object, according to a fourth aspect of the present invention, there is provided the measured-signal repetition frequency detection method according to the third aspect, wherein the fifth stage (S17, S18, S19) is such that the frequency change amount dFh_meas of the specified signal is detected as obtained in the case where the measured signal is sampled with the sampling frequency changed from the given repetition frequency Fs as the provisional sampling frequency in the first stage (S11, S12) by as great as the frequency dFs to generate the frequency fold at a time of sampling, the change amount dn of the sample number n is calculated from Equation (3):

$$dFh\_target = dn \cdot (Fs + dFs) + n \cdot dFs \quad (3)$$

(where dFh_target is a target value of the frequency change amount of the specified signal due to a large change in the sampling frequency, which target value is an arbitrary frequency determined within a range of 0 to dFs/2, n is the sample number calculated by Equation (1), dn is the change amount of the sample number n due to a large change of the sampling frequency, and a large change amount dFs of the sampling frequency is determined within a range capable of being established in a range of a frequency fluctuation estimated to be contained in the measured signal), and when the frequency change amount dFh_meas of the specified signal is expressed by Equation (4):

$$dFh\_meas = dn \cdot (Fs + dFs) + (n + en) \cdot dFs \quad (4)$$

(where en is the error contained in the sample number n), the error en contained in the sample number n is calculated from Equation (5) obtained by taking the difference between Equations (3) and (4):

$$en = (dFh\_meas - dFh\_target)/dFs \quad (5).$$

In order to achieve the above-described object, according to a fifth aspect of the present invention, there is provided the measured-signal repetition frequency detection method according to the fourth aspect, wherein the sixth stage (S20) is such that an accurate sample number n+en is obtained by adding the error en contained in the sample number n calculated in the fifth stage (S17, S18, S19) to the sample number n calculated in the third stage (S15), the accurate sample number n+en is reflected in the Equation (2) as ΔFh/ΔFs indicating the sample number, and thereby correcting the provisional repetition frequency Fx' of the measured signal calculated by the Equation (2), the regular repetition frequency Fx of the measured signal is calculated.

In order to achieve the above-described object, according to a sixth aspect of the present invention, there is provided a measured-signal sampling apparatus comprising:

an input terminal (21a) to input a measured signal;

a signal generating unit (24) which selectively generates a clock signal of first to third sampling frequencies in accordance with a designation;

a sampling pulse generating unit (25) which selectively generates, as the first to third sampling frequencies synchronized with the clock signal from the signal generating unit (24) and in accordance with the designation, a first sampling pulse having a provisional sampling frequency Fs, a second sampling pulse having a sampling frequency changed by a minuscule frequency ΔFs not generating a frequency fold from the provisional sampling frequency Fs at a time of sampling, and a third sampling pulse having a sampling frequency changed from the provisional sampling frequency Fs by a large frequency dFs to generate the frequency fold at a time of sampling;

a sampling unit (26) which selectively samples the measured signal with the first to third sampling pulses from the sampling pulse generating unit (25);

a specified signal frequency detector (27) which detects a frequency Fh of the specified signal appearing in a band not more than one half of the provisional sampling frequency Fs among signals obtained in a case where the measured signal is sampled by the sampling unit (26) with the first sampling pulse from the sampling pulse generating unit (25);

a frequency change amount calculation unit (29) which calculates a frequency change amount ΔFh of the specified signal detected by the specified signal frequency detector (27) at a time of sampling the measured signal by the sampling unit (26) with the second sampling pulse from the sampling pulse generating unit (25);

a provisional repetition frequency calculation unit (28) which calculates a provisional repetition frequency Fx' of the measured signal based on the provisional sampling frequency Fs generated by the sampling pulse generating unit (25), the minuscule frequency ΔFs as a change amount of the sampling frequency, the frequency Fh of the specified signal for the provisional sampling frequency Fs detected by the specified signal frequency detector (27) and the frequency change amount ΔFh of the specified signal calculated by the frequency change amount calculation unit (29);

a sample number calculation unit (33) which calculates a sample number n from Equation (1) below:

$$n = \Delta Fh / \Delta Fs \quad (1)$$

where a denominator is the minuscule frequency ΔFs used in the provisional repetition frequency calculation unit (28) and a numerator is the frequency change amount ΔFh used in the provisional repetition frequency calculation unit (28);

a specified signal frequency change amount detector (30) which detects a frequency change amount dFh of the specified signal obtained in a case where the measured signal is sampled by the sampling unit (26) with the third sampling pulse from the sampling pulse generating unit (25);

a sample number error calculation unit (31) which calculates an error en contained in the sample number n calculated by the sample number calculation unit (33) with a frequency fluctuation contained in the measured signal, based on the frequency change amount dFh of the specified signal detected by the specified signal frequency change amount detector (30) and a change amount dn of the sample number n calculated by the sample number calculation unit (33) indicating how many times the frequency fold has occurred in this process; and a regular repetition frequency calculation unit (32) which calculates a regular repetition frequency Fx of the measured signal by correcting the provisional repetition frequency Fx' of the measured signal calculated by the provisional repetition frequency calculation unit (28) based on the error en contained in the sample number n calculated by the sample number error calculation unit (31).

In order to achieve the above-described object, according to a seventh aspect of the present invention, there is provided the measured-signal sampling apparatus according to the sixth aspect, wherein the specified signal frequency detector (27) causes to generate the first sampling pulse having the provisional sampling frequency from the sampling pulse generating unit (25) by designating, for the signal generating unit (24), the provisional sampling frequency having a given repetition frequency Fs as the first sampling frequency in accordance with the designation and detects the frequency Fh of the specified signal appearing in a band Fs/2 not more than one half of the given repetition frequency Fs among the signals obtained in the case where the measured signal is sampled by the sampling unit (26) with the first sampling pulse having the provisional sampling frequency.

In order to achieve the above-described object, according to an eighth aspect of the present invention, there is provided the measured-signal sampling apparatus according to the seventh aspect, wherein the frequency change amount calculation unit (29) causes to generate the second sampling pulse from the sampling pulse generating unit (25) by designating, for the signal generating unit (24), the sampling frequency having the frequency changed from the given repetition frequency Fs by a minuscule frequency ΔFs not generating the frequency fold at a time of sampling as the second sampling frequency in accordance with the designation and calculates the frequency change amount ΔFh of the specified signal obtained in a case where the measured signal is sampled by the sampling unit (26) with the second sampling pulse.

In order to achieve the above-described object, according to a ninth aspect of the present invention, there is provided the measured-signal sampling apparatus according to the eighth aspect, wherein the provisional repetition frequency calculation unit (28) calculates the provisional repetition frequency Fx' of the measured signal from Equation (2) below:

$$Fx' = Fh - Fs \cdot \Delta Fh / \Delta Fs \ldots \text{(in the case where } 0 > \Delta Fh / \Delta Fs\text{)}$$

$$Fx' = -Fh + Fs \cdot \Delta Fh / \Delta Fs \ldots \text{(in the case where } 0 < \Delta Fh / \Delta Fs\text{)} \quad (2)$$

based on the provisional sampling frequency Fs from the sampling pulse generating unit (25), the minuscule frequency ΔFs as a change amount of the sampling frequency, the frequency Fh of the specified signal for the provisional sampling frequency detected by the specified signal frequency detector (27) and the frequency change amount ΔFh of the specified signal calculated by the frequency change amount calculation unit (29).

In order to achieve the above-described object, according to a tenth aspect of the present invention, there is provided the measured-signal sampling apparatus according to the ninth aspect, wherein the specified signal frequency change amount detector (30) causes to generate the third sampling pulse from the sampling pulse generating unit (25) by designating, for the signal generating unit (24), the sampling frequency having a frequency changed from the given repetition frequency Fs by a large change amount dFs to generate the frequency fold at the time of sampling as the third sampling frequency in accordance with the designation and detects the frequency change amount dFh_meas of the specified signal obtained in a case where the measured signal is sampled with the third sampling pulse by the sampling unit (26), thereby calculating the change amount dn of the sample number n from Equation (3):

$$dFh\_target = dn \cdot (Fs + dFs) + n \cdot dFs \quad (3)$$

(where dFh_target is a target value of the frequency change amount of the specified signal due to the large change in the sampling frequency and an arbitrary frequency determined within a range of 0 to dFs/2, n is the sample number calculated by the sample number calculation unit (33), dn is the change amount of the sample number n due to a large change in the sample frequency, and the large change amount dFs of the sampling frequency is determined in such a manner as to be established within a range of frequency fluctuation estimated to be contained in the measured signal).

In order to achieve the above-described object, according to an eleventh aspect of the present invention, there is provided the measured-signal sampling apparatus according to the tenth aspect, wherein the sample number error calculation unit (31), when the frequency change amount dFh_meas of the specified signal detected by the specified signal frequency change amount detector (30) is expressed by Equation (4):

$$dFh\_meas = dn \cdot (Fs + dFs) + (n + en) \cdot dFs \quad (4)$$

(where en is the error contained in the sample number n), calculates the error en contained in the sample number n according to Equation (5) obtained by taking the difference between Equations (3) and (4):

$$en = (dFh\_meas - dFh\_target)/dFs \quad (5).$$

In order to achieve the above-described object, according to a twelfth aspect of the present invention, there is provided the measured-signal sampling apparatus according to the eleventh aspect, wherein the regular repetition frequency calculation unit (32) adds the error en contained in the sample number n calculated by the sample number error calculation unit (31) to the sample number n calculated by the sample number calculation unit (33) thereby to acquire an accurate sample number n+en, which is reflected in the Equation (2) as $\Delta Fh/\Delta Fs$ indicating the sample number n calculated by the sample number calculation unit (33), thereby calculating the regular repetition frequency Fx of the measured signal by correcting the provisional repetition frequency Fx' of the measured signal calculated according to the Equation (2).

In order to achieve the above-described object, according to a thirteenth aspect of the present invention, there is provided the measured-signal sampling apparatus according to the twelfth aspect, further comprising an arithmetic unit (23) which calculates, as the regular sampling frequency for the measured signal, a frequency Fs corresponding to a period Ts different by a predetermined offset delay time $\Delta T$ from an integer multiple of a repetition period Tx corresponding to the regular repetition frequency Fx calculated by the regular repetition frequency calculation unit (32), and by designating this calculated regular sampling frequency for the signal generating unit (24), causes the sampling pulse generating unit (25) to generate a sampling pulse having the regular sampling frequency in place of the first to third sampling pulses, and permits the sampling unit (26) to sample the measured signal with the sampling pulse having the regular sampling frequency.

In order to achieve the above-described object, according to a fourteenth aspect of the present invention, there is provided the measured-signal sampling apparatus according to the thirteenth aspect, further comprising:

a clock output terminal (21*b*) which outputs the clock signal from the signal generating unit (24) to an external unit; and a sample signal output terminal (21*c*) which outputs the signal from the sampling unit (26) to an external unit.

In order to achieve the above-described object, according to a fifteenth aspect of the present invention, there is provided a measured-signal waveform observation system comprising:

an input terminal (21*a*) to input a measured signal;

a signal generating unit (24) which selectively generates a clock signal of first to third sampling frequencies in accordance with a designation and a fourth sampling frequency in accordance with a designation;

a sampling pulse generating unit (25) which selectively generates, as the first to third sampling frequencies synchronized with the clock signal from the signal generating unit (24) and in accordance with the designation, a first sampling pulse having a provisional sampling frequency Fs, a second sampling pulse having a sampling frequency changed from the provisional sampling frequency Fs by a minuscule frequency $\Delta Fs$ not generating a frequency fold at a time of sampling, a third sampling pulse having a sampling frequency changed from the provisional sampling frequency Fs largely to generate the frequency fold at a time of sampling and a fourth sampling pulse having a fourth sampling frequency in accordance with the designation;

a sampling unit (26) which selectively samples the measured signal with the first to third sampling pulses and the fourth sampling pulse from the sampling pulse generating unit (25);

a specified signal frequency detector (27) which detects a frequency Fh of the specified signal appearing in a band not more than one half of the provisional sampling frequency Fs among signals obtained in a case where the measured signal is sampled by the sampling unit (26) with the first sampling pulse from the sampling pulse generating unit (25);

a frequency change amount calculation unit (29) which calculates a frequency change amount $\Delta Fh$ of the specified signal obtained at a time of sampling the measured signal by the sampling unit (26) with the second sampling pulse from the sampling pulse generating unit (25);

a provisional repetition frequency calculation unit (28) which calculates a provisional repetition frequency Fx' of the measured signal, based on the provisional sampling frequency Fs generated by the sampling pulse generating unit (25), the minuscule frequency $\Delta Fs$ as a change amount of the sampling frequency, the frequency Fh of the specified signal for the provisional sampling frequency Fs detected by the specified signal frequency detector (27) and the frequency change amount $\Delta Fh$ of the specified signal calculated by the frequency change amount calculation unit (29);

a sample number calculation unit (33) which calculates a sample number n from Equation (1) below:

$$n = \Delta Fh/\Delta Fs \quad (1)$$

where a denominator is the minuscule frequency $\Delta Fs$ used in the provisional repetition frequency calculation unit (28) and a numerator is the frequency change amount $\Delta Fh$ used in the provisional repetition frequency calculation unit (28);

a specified signal frequency change amount detector (30) which detects a frequency change amount dFh_meas of the specified signal obtained in a case where the measured signal is sampled by the sampling unit (26) with the third sampling pulse from the sampling pulse generating unit (25);

a sample number error calculation unit (31) which calculates an error en contained in the sample number n calculated by the sample number calculation unit (33) with a frequency fluctuation contained in the measured signal, based on the frequency change amount dFh_meas of the specified signal detected by the specified signal frequency change amount detector (30) and a change amount dn of the sample number n calculated by the sample number calculation unit (33) indicating how many times the frequency fold has occurred in this process;

a regular repetition frequency calculation unit (32) which calculates a regular repetition frequency Fx of the measured signal by correcting the provisional repetition frequency Fx' of the measured signal calculated by the provisional repetition frequency calculation unit (28) based on the error en contained in the sample number n calculated by the sample number error calculation unit (31);

an arithmetic unit (23) which calculates, as a regular sampling frequency for the measured signal, the frequency Fs corresponding to a period Ts different by a predetermined offset delay time $\Delta T$ from an integer multiple of a repetition period Tx corresponding to the regular repetition frequency Fx calculated by the regular repetition frequency calculation unit (32), and by designating this calculated regular sampling frequency as the fourth sampling frequency for the signal generating unit (24), causes to generate the fourth sampling pulse from the sampling pulse generating unit (25) and causes the sampling unit (26) to sample the measured signal with the fourth sampling pulse;

an analog/digital (A/D) converter (43) which converts a signal sampled with the fourth sampling pulse by the sampling unit (26) into digital waveform data, and outputs the waveform data;

a waveform data memory (45) which stores the waveform data output from the A/D converter (43);

a data acquisition control unit (44) which writes the waveform data output from the A/D converter (43) into the waveform data memory (45) in synchronism with the clock signal from the signal generating unit (24); and a display control unit (46) which reads a series of waveform data stored in the waveform data memory (45) and displays the waveform data at intervals corresponding to the offset delay time on a time axis of a display unit (46).

In order to achieve the above-described object, according to a sixteenth aspect of the present invention, there is provided the measured-signal waveform observation system according to the fifteenth aspect, wherein the specified signal frequency detector (27), by designating a provisional sampling frequency having a given repetition frequency Fs for the signal generating unit (24) as a first sampling frequency in accordance with the designation, causes the sampling pulse generating unit (25) to generate the first sampling pulse having the provisional sampling frequency and detects the frequency Fh of the specified signal appearing in a band Fs/2 not more than one half of the given repetition frequency Fs among signals obtained in a case where the measured signal is sampled by the sampling unit (26) with the first sampling pulse having the provisional sampling frequency.

In order to achieve the above-described object, according to a seventeenth aspect of the present invention, there is provided the measured-signal waveform observation system according to the sixteenth aspect, wherein the frequency change amount calculation unit (29), by designating the sampling frequency having a frequency changed from the given repetition frequency Fs by a minuscule frequency $\Delta Fs$ not generating the frequency fold at a time of sampling as the second sampling frequency in accordance with the designation for the signal generating unit (24), causes the sampling pulse generating unit (25) to generate the second sampling pulse, and calculates the frequency change amount $\Delta Fh$ of the specified signal obtained in a case where the measured signal is sampled by the sampling unit (26) with the second sampling pulse.

In order to achieve the above-described object, according to an eighteenth aspect of the present invention, there is provided the measured-signal waveform observation system according to the seventeenth aspect, wherein the provisional repetition frequency calculation unit (28) calculates the provisional repetition frequency Fx' of the measured signal from Equation (2) below:

$$Fx'=Fh-Fs \cdot \Delta Fh/\Delta Fs \ldots \text{(in the case where } 0>\Delta Fh/\Delta Fs)$$

$$Fx'=-Fh+Fs \cdot \Delta Fh/\Delta Fs \ldots \text{(in the case where } 0<\Delta Fh/\Delta Fs) \quad (2)$$

based on the provisional sampling frequency Fs from the sampling pulse generating unit (25), the minuscule frequency $\Delta Fs$ as a change amount of the sampling frequency, the frequency Fh of the specified signal for the provisional sampling frequency Fs detected by the specified signal frequency detector (27) and the frequency change amount $\Delta Fh$ of the specified signal calculated by the frequency change amount calculation unit (29).

In order to achieve the above-described object, according to a nineteenth aspect of the present invention, there is provided the measured-signal waveform observation system according to the eighteenth aspect, wherein the specified signal frequency change amount detector (30), by designating, for the signal generating unit (24), the sampling frequency having a frequency changed from the given repetition frequency Fs by a large frequency to generate the frequency fold at a time of sampling as the third sampling frequency in accordance with the designation, causes to generate the third sampling pulse from the sampling pulse generating unit (25) and detects the frequency change amount dFh_meas of the specified signal obtained in a case where the measured signal is sampled by the sampling unit (26) with the third sampling pulse, thereby calculating the change amount dn of the sample number n from Equation (3):

$$dFh\_target=dn \cdot (Fs+dFs)+n \cdot dFs \quad (3)$$

(where dFh_target is a target value of the frequency change amount of the specified signal due to a large change in the sampling frequency and an arbitrary frequency determined within a range of 0 to dFs/2, n is the sample number calculated by the sample number calculation unit (33), dn is the change amount of the sample number n due to a large change in the sample frequency, and a large change amount dFs of the sampling frequency is determined within a range capable of being established in a range of a frequency fluctuation estimated to be contained in the measured signal).

In order to achieve the above-described object, according to a twentieth aspect of the present invention, there is provided the measured-signal waveform observation system according to the nineteenth aspect, wherein the sample number error calculation unit (31), when the frequency change amount dFh_meas of the specified signal detected by the specified signal frequency change amount detector (30) is expressed by Equation (4):

$$dFh\_meas = dn \cdot (Fs + dFs) + (n + en) \cdot dFs \quad (4)$$

(where en is the error contained in the sample number n), calculates the error en contained in the sample number n according to Equation (5) obtained by taking the difference between Equations (3) and (4):

$$en = (dFh\_meas - dFh\_target)/dFs \quad (5).$$

In order to achieve the above-described object, according to a twenty-first aspect of the present invention, there is provided the measured-signal waveform observation system according to the twentieth aspect, wherein the regular repetition frequency calculation unit (32) adds the error en contained in the sample number n calculated by the sample number error calculation unit (31) to the sample number n calculated by the sample number calculation unit (33) thereby to acquire an accurate sample number n+en, which is reflected in the Equation (2) as ΔFh/ΔFs indicating the sample number n calculated by the sample number calculation unit (33), and thereby correcting the provisional repetition frequency Fx' of the measured signal calculated in the Equation (2), the regular repetition frequency Fx of the measured signal is calculated.

In order to achieve the above-described object, according to a twenty-second aspect of the present invention, there is provided the measured-signal waveform observation system according to the fifteenth aspect, wherein the specified signal frequency detector (27) is configured to detect each of frequency of a plurality of specified signals appearing in a band not more than one half of the first sampling frequency, the provisional repetition frequency calculation unit (28) is configured to, based on the frequency change amount of the plurality of specified signals detected by the specified signal frequency detector (27), obtain a spectrum of a plurality of frequency components contained in the measured signal, and the display control unit (47) is configured to display the spectrum obtained by the provisional repetition frequency calculation unit (28) on a frequency axis of the display unit (46) through the regular repetition frequency calculation unit (32).

As described above, in the measured-signal repetition frequency detection method according to this invention, the provisional repetition frequency of the measured signal is determined from the frequency change amount of a specified signal obtained at the time of sampling by changing the sampling frequency from the provisional sampling frequency by a minuscule amount not causing the frequency fold, and the frequency change amount of the specified signal is detected by sequentially sampling the measured signal at the sampling frequency changed from the provisional sampling frequency so greatly as to cause the frequency fold. Based on the frequency change amount of the specified signal thus detected and the change amount of the sample number indicating how many times the frequency fold has occurred in this process, the error contained in the sample number with the frequency fluctuation contained in the measured signal is calculated, and based on the error contained in the sample number, the provisional repetition frequency of the measured signal is corrected thereby to calculate the regular repetition frequency of the measured signal. Even in the presence of a frequency fluctuation in the measured signal, therefore, the repetition frequency of the waveform of the measured signal can be detected with high accuracy.

Also, in the measured-signal sampling apparatus and the waveform observation system according to the invention, the sampling frequency is accurately set for the signal of an unknown frequency using the measured-signal repetition frequency detection method described above, so that even in the presence of a frequency fluctuation in the measured signal, the measured signal can be sampled with high accuracy, while at the same time making possible the waveform observation of the measured signal with high accuracy.

BRIEF DESCRIPTION OF DRAWINGS

FIG. 7 is a block diagram showing an example of the configuration of the essential parts of the waveform observation system including the measured-signal sampling apparatus according to the second embodiment of the invention.

FIG. 8 is a block diagram showing an example of the configuration of the essential parts of the waveform observation system including the measured-signal sampling apparatus according to the second embodiment of the invention.

FIG. 9 is a block diagram shown for explaining the configuration of a waveform observation system including a measured-signal sampling apparatus according to a third embodiment of the invention.

FIG. 10 is a block diagram shown for explaining the configuration of the conventional waveform observation apparatus.

FIG. 11 is a diagram shown for explaining the operation of the conventional waveform observation apparatus.

FIG. 14 is a flowchart shown for explaining the measured-signal repetition frequency detection method according to the Japanese prior application filed by the present inventor.

FIG. 17 is a diagram shown for explaining the operation of the essential parts of the waveform observation system including the measured-signal sampling apparatus according to the Japanese prior application filed by the present inventor.

FIG. 19 is a diagram shown for explaining an example of the waveform observed by the waveform observation system including the measured-signal sampling apparatus according to the Japanese prior application filed by the present inventor.

BEST MODE FOR CARRYING OUT THE INVENTION

Embodiments of the invention will be explained below with reference to the drawings.

First Embodiment

Figure 1:
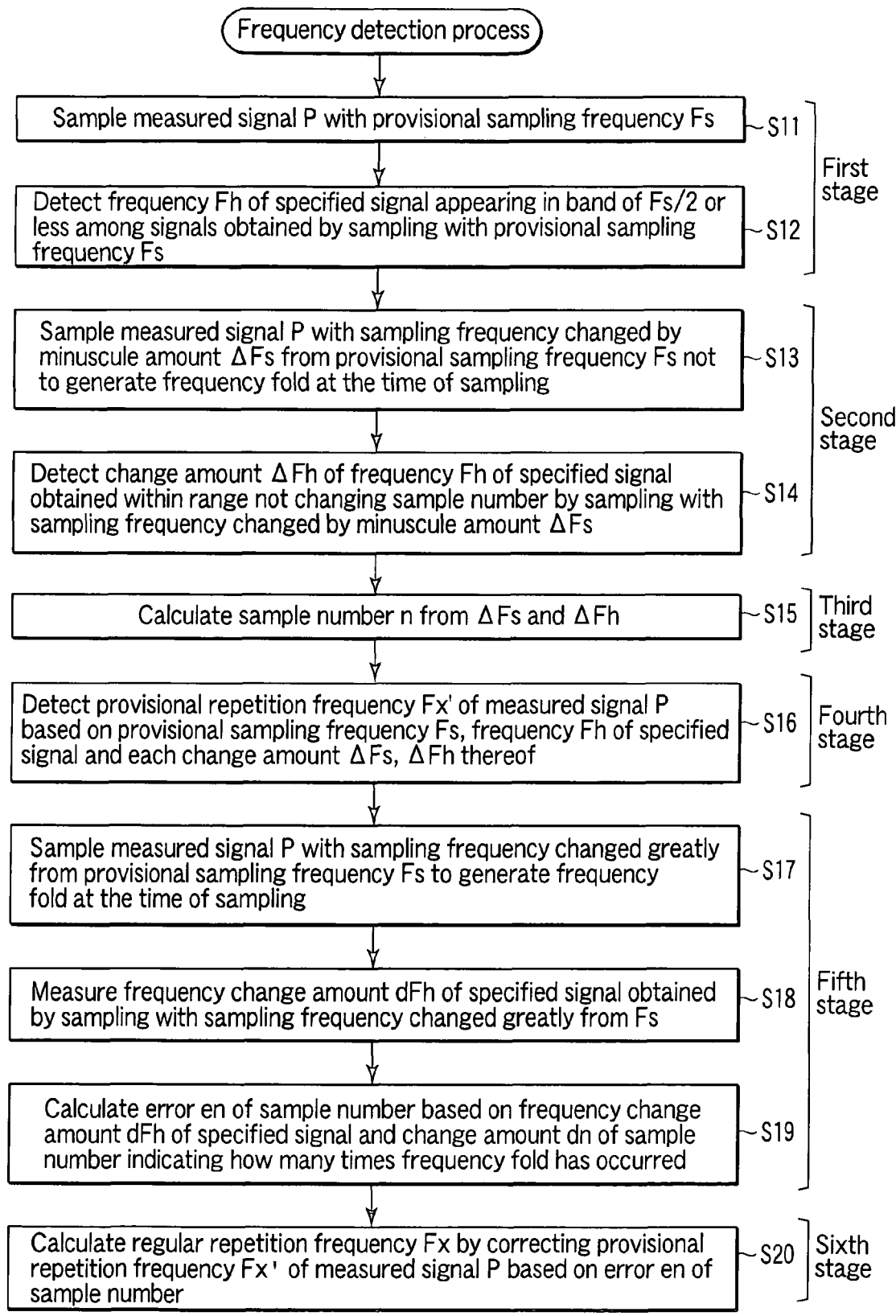
FIG. 1 is a flowchart shown for explaining the steps of a measured-signal repetition frequency detection method according to a first embodiment of the invention.

FIG. 1 is a flowchart shown for explaining the steps of a measured-signal repetition frequency detection method according to a first embodiment of the invention.

The measured-signal repetition frequency detection method according to the invention basically is characterized by including a first stage (S11, S12) for detecting a frequency Fh of a specified signal appearing in the band not more than one half of a provisional sampling frequency Fs among the signals obtained by sampling the measured signal with the provisional sampling frequency Fs; a second stage (S13, S14) for calculating a frequency change amount ΔFh of the specified signal obtained by the sampling frequency changed from the provisional sampling frequency Fs by a minuscule frequency ΔFs not generating a frequency fold at the time of sampling; a third stage (S15) for calculating a sample number n from Equation (1):

$$n = \Delta Fh / \Delta Fs \quad (1)$$

having the denominator equal to the minuscule frequency ΔFs in the second stage (S13, S14) and the numerator equal to the frequency change amount ΔFh of the specified signal; a fourth stage (S16) for calculating a provisional repetition frequency Fx' of the measured signal based on the provisional sampling frequency Fs, the frequency Fh of the specified signal for the provisional sampling frequency Fs, the minuscule frequency ΔFs as a change amount of the sampling frequency and the frequency change amount ΔFh of the specified signal; a fifth stage (S17, S18, S19) for detecting a frequency change amount dFh meas of the specified signal obtained in the case where the measured signal is sequentially sampled with the sampling frequency changed by a frequency dFs from the provisional sampling frequency Fs so greatly as to generate the frequency fold at the time of sampling and calculating an error en contained in the sample number n calculated in the third stage (S15) with a frequency fluctuation contained in the measured signal, based on the detected frequency change amount dFh meas of the specified signal and a change amount dn of the sample number n calculated in the third stage (S15) indicating how many times the frequency fold has occurred in the process; and a sixth stage (S20) for calculating a regular repetition frequency Fx of the measured signal by correcting the provisional repetition frequency Fx' of the measured signal calculated in the fourth stage (S16) based on the error en contained in the sample number n calculated in the fifth stage (S17, S18, S19).

Specifically, as shown in FIG. 1, the measured optical signal P is first sampled at the provisional sampling frequency Fs (step S11).

Next, among the signals obtained by sampling in step S11, the frequency Fh of the specified signal appearing in the band of not more than one half of the provisional sampling frequency Fs is detected (step S12).

Steps S11, S12 make up the first stage.

Next, the measured optical signal P is sampled at the sampling frequency Fs+ΔFs obtained by changing the sampling frequency by the minuscule frequency ΔFs not generating the frequency fold from the provisional sampling frequency Fs at the time of sampling (step S13).

Next, the frequency change amount ΔFh of the specified signal obtained within a range not changing the sample number by sampling in step S13 is calculated (step S14).

Steps S13, S14 make up the second stage.

Next, the sample number n is calculated from Equation (1):

$$n = \Delta Fh / \Delta Fs \quad (1)$$

where the denominator is the minuscule frequency ΔFs in the second stage (step S13, S14) and the numerator is the frequency change amount ΔF of the specified signal (step S15, third stage).

Next, the provisional repetition frequency Fx' of the measured optical signal P is calculated based on the provisional sampling frequency Fs, the frequency Fh of the specified signal for the provisional sampling frequency Fs, the change amount ΔFs of the sampling frequency and the frequency change amount ΔFh of the specified signal (step S16, fourth stage).

Next, the measured optical signal P is sampled at the sampling frequency changed greatly by the frequency dFs from the provisional sampling frequency Fs to cause the frequency fold at the time of sampling (step S17).

Next, the frequency change amount dFh of the specified signal obtained by sampling in step S17 is measured (step S18).

Next, the error en contained in the sample number n calculated in the third stage (step S15) with a frequency fluctuation contained in the measured optical signal P is calculated based on the frequency change amount dFh of the specified signal measured in step S18 and the change amount dn of the sample number n calculated in the third stage (step S15) indicating how many times the frequency fold has occurred in this process (step S19).

Steps S17, S18, S19 make up the fifth stage.

Next, the regular repetition frequency Fx of the measured optical signal P is calculated (step S20, sixth stage), by correcting the provisional repetition frequency Fx' of the measured optical signal P calculated in the third stage (step S15) based on the error en contained in the sample number n calculated in the fifth stage (steps S17, S18, S19).

In the first stage (steps S11, S12) described above, among the signals obtained by sampling the measured optical signal P at the sampling frequency having a given repetition frequency Fs as the provisional sampling frequency, the frequency Fh of the signal indicating the maximum level is detected as the specified signal appearing in the band not more than one half of the given repetition frequency Fs.

In the second stage (steps S13, S14), the frequency change amount ΔFh of the specified signal is detected which is obtained in the case where the measured optical signal P is sampled by changing, from the given repetition frequency Fs as the provisional sampling frequency in the first stage (steps S11, S12), the sampling frequency by a minuscule frequency ΔFs not generating the frequency fold at the time of sampling.

In the third stage (step S15), the sample number n is calculated from Equation (1):

$$n = \Delta Fh/\Delta Fs \quad (1)$$

where the denominator is the minuscule frequency ΔFs in the second stage (steps S13, S14) and the numerator is the frequency change amount ΔFh of the specified signal.

In the fourth stage (step S16), the provisional repetition frequency Fx' of the measured signal is calculated from Equation (2):

$$Fx' = Fh - Fs \cdot \Delta Fh/\Delta Fs \ldots \text{(in the case where } 0 > \Delta Fh/\Delta Fs)$$

$$Fx' = -Fh + Fs \cdot \Delta Fh/\Delta Fs \ldots \text{(in the case where } 0 < \Delta Fh/\Delta Fs) \quad (2)$$

based on the frequency Fh of the signal indicating the maximum level as the specified signal appearing in the band Fs/2 not more than one half of the given repetition frequency Fs detected in the first stage (steps S11, S12) and the frequency change amount ΔFh of the specified signal obtained in the case where the measured signal is sampled by changing, from the given repetition frequency Fs, the provisional sampling frequency detected in the second stage (steps S13, S14), by the minuscule frequency ΔFs not generating the frequency fold at the time of sampling.

In the fifth stage (steps S17, S18, S19), the frequency change amount dFh_meas of the specified signal obtained in the case where the measured signal is sampled by changing the sampling frequency greatly by the frequency dFs from the given repetition frequency Fs as the provisional sampling frequency in the first stage (steps S11, S12) so as to generate the frequency fold at the time of sampling is detected. Then, the change amount dn of the sample number n is calculated from Equation (3):

$$dFh\_target = dn \cdot (Fs + dFs) + n \cdot dFs \quad (3)$$

(where dFh_target is a target value of the frequency change amount of the envelope signal due to a great change in the sampling frequency, which target value is an arbitrary frequency determined within the range of 0 to dFs/2, where n is the sample number calculated by Equation (1), dn the change amount of the sample number n due to a great change of the sampling frequency, and where the great change amount dFs of the sampling frequency is determined within a range adapted for establishment within the range of the frequency fluctuation estimated to be contained in the measured signal). At the same time, in the case where the frequency change amount dFh_meas of the specified signal is expressed by Equation (4):

$$dFh\_meas = dn \cdot (Fs + dFs) + (n + en) \cdot dFs \quad (4)$$

(where en is the error contained in the sample number n), the error en contained in the sample number n is calculated from Equation (5) obtained by taking the difference between Equations (3) and (4):

$$en = (dFh\_meas - dFh\_target)/dFs \quad (5).$$

In the sixth stage (step S20), the accurate sample number n+en is obtained by adding the error en contained in the sample number n calculated in the fifth stage (steps S17, S18, S19) to the sample number n calculated in the third stage (step S15), so that the value n+en is reflected as ΔFh/ΔFs indicating the sample number n in Equation (2), and thereby correcting the provisional repetition frequency Fx' of the measured signal calculated in Equation (2), the regular repetition frequency Fx of the measured signal is calculated.

Figure 2:
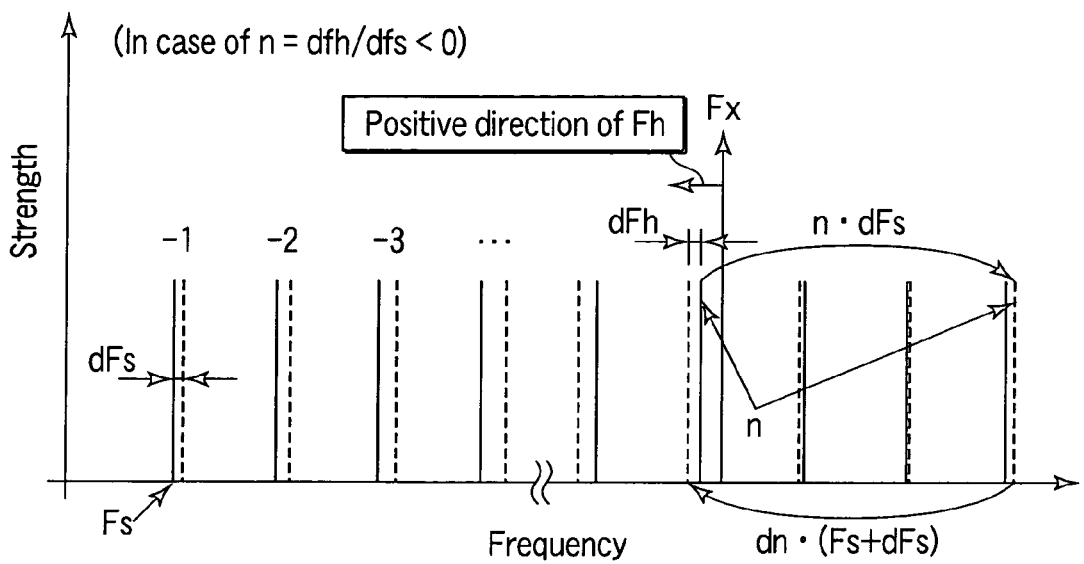
FIG. 2 is a diagram shown for explaining the principle of the measured-signal repetition frequency detection method according to the first embodiment of the invention.
Figure 3:
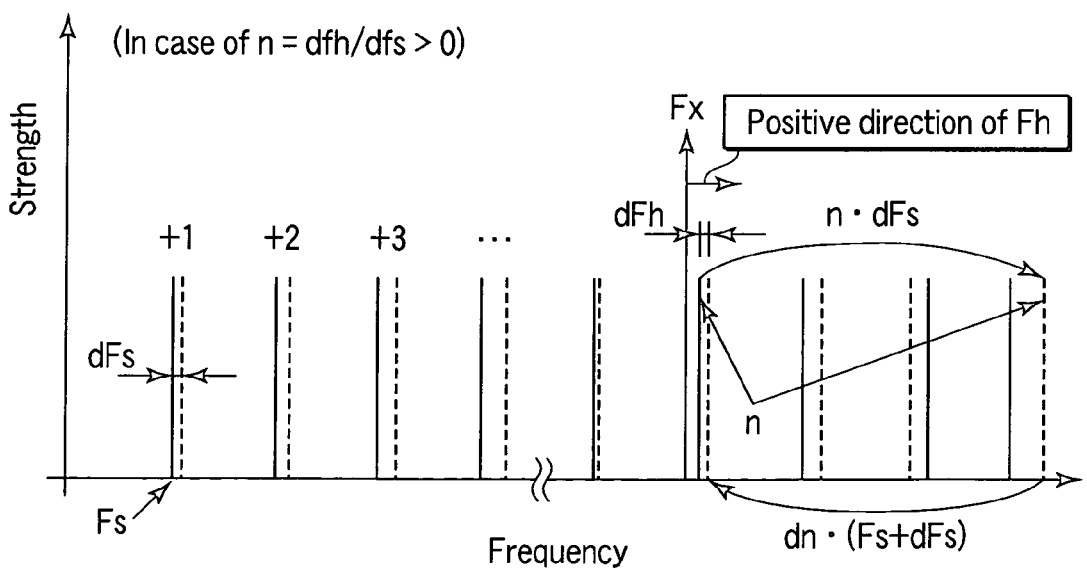
FIG. 3 is a diagram shown for explaining the principle of the measured-signal repetition frequency detection method according to the first embodiment of the invention.

FIGS. 2 and 3 respectively show, ΔFn/ΔFs indicating the sample number n is a case of a value smaller than 0 (FIG. 2) and a case of a value larger than 0 (FIG. 3) in order to explain the principle of the measured-signal repetition frequency detection method according to the invention described above.

In FIGS. 2 and 3, n·dFs indicates the frequency change amount of the n-th harmonic component due to the change of the sampling frequency by dFs and dn·(Fs+dFs) indicates the frequency return amount due to the frequency fold.

Now, the maximum error amount which may be contained in the sample number n is studied. Assume that the estimated frequency fluctuation amount is ±x [ppm], the regular repetition frequency of the measured signal calculated in each step is Fx and the change amount of the sampling frequency is dFs. Then, the error amount y which may be contained in n can be estimated as y=±x·Fx/dFs.

In the case where the absolute value of this error amount y fails to reach ½, the calculated n value (rounded off to the nearest integer) can be judged as free of error.

Next, the range in which the change amount dFs of the sampling frequency can be set is studied.

In this case, a change in the sampling frequency by dFs changes the frequency of the specified signal by n·dFs.

Taking the error amount y which may be contained in n into consideration, the actual value may be different by ±y·dFs from the predicted value (n·dFs) of the frequency change.

Therefore, the range in which the change amount dFs of the sampling frequency can be set is required to meet the condition that the value of the change amount dn of the sample number n can be established even in the case where ±y·dFs is taken into consideration.

For judgment about the end of the measured-signal repetition frequency detection method described above, steps S17 to S20 are required to be repeatedly executed in the case where the absolute value of the error amount y which may be contained in n is not less than ½.

In this case, the change amount dFs of the sampling frequency is gradually increased each time steps S17 to S20 are repeated, and therefore, the absolute value of the error amount y which may be contained in n is gradually converged to one half or less and the end can be judged.

In the measured-signal repetition frequency detection method according to the first embodiment of the invention, therefore, the provisional repetition frequency of the measured signal is determined from the frequency change amount of the specified signal obtained at the time of sampling by changing the sampling frequency from the provisional sampling frequency by a minuscule amount not generating the frequency fold, and the frequency change amount of the specified signal is measured as obtained in the case where the measured signal is sequentially sampled at the sampling frequency changed from the provisional sampling frequency greatly to generate the frequency fold at the time of sampling. Then, based on the frequency change amount of the specified signal thus measured and the change amount of the sample number indicating how many times the frequency fold has occurred in this case, the error contained in the sample number with a frequency fluctuation contained in the measured signal is calculated, and based on the error contained in this sample number, the provisional repetition frequency of the measured signal is corrected thereby to calculate the regular repetition frequency of the measured signal. Even in the presence of a frequency fluctuation in the measured signal, therefore, the repetition frequency of the measured signal waveform can be detected with high accuracy.

Second Embodiment

Figure 4:
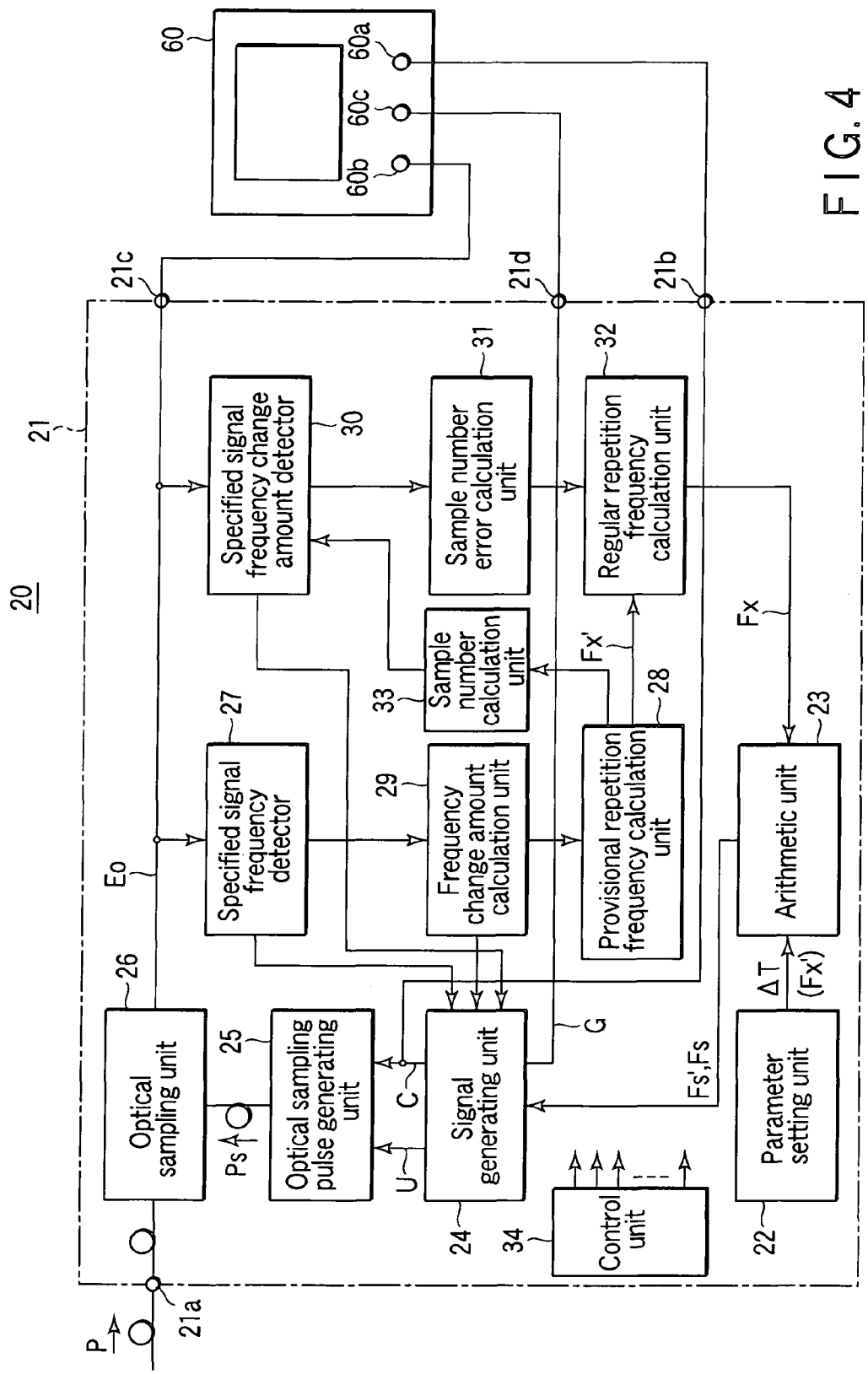
FIG. 4 is a block diagram shown for explaining the configuration of a waveform observation system including a measured-signal sampling apparatus according to a second embodiment of the invention.

FIG. 4 is a block diagram shown for explaining the configuration of a waveform observation system including a measured-signal sampling apparatus according to a second embodiment of the invention.

Figure 15:
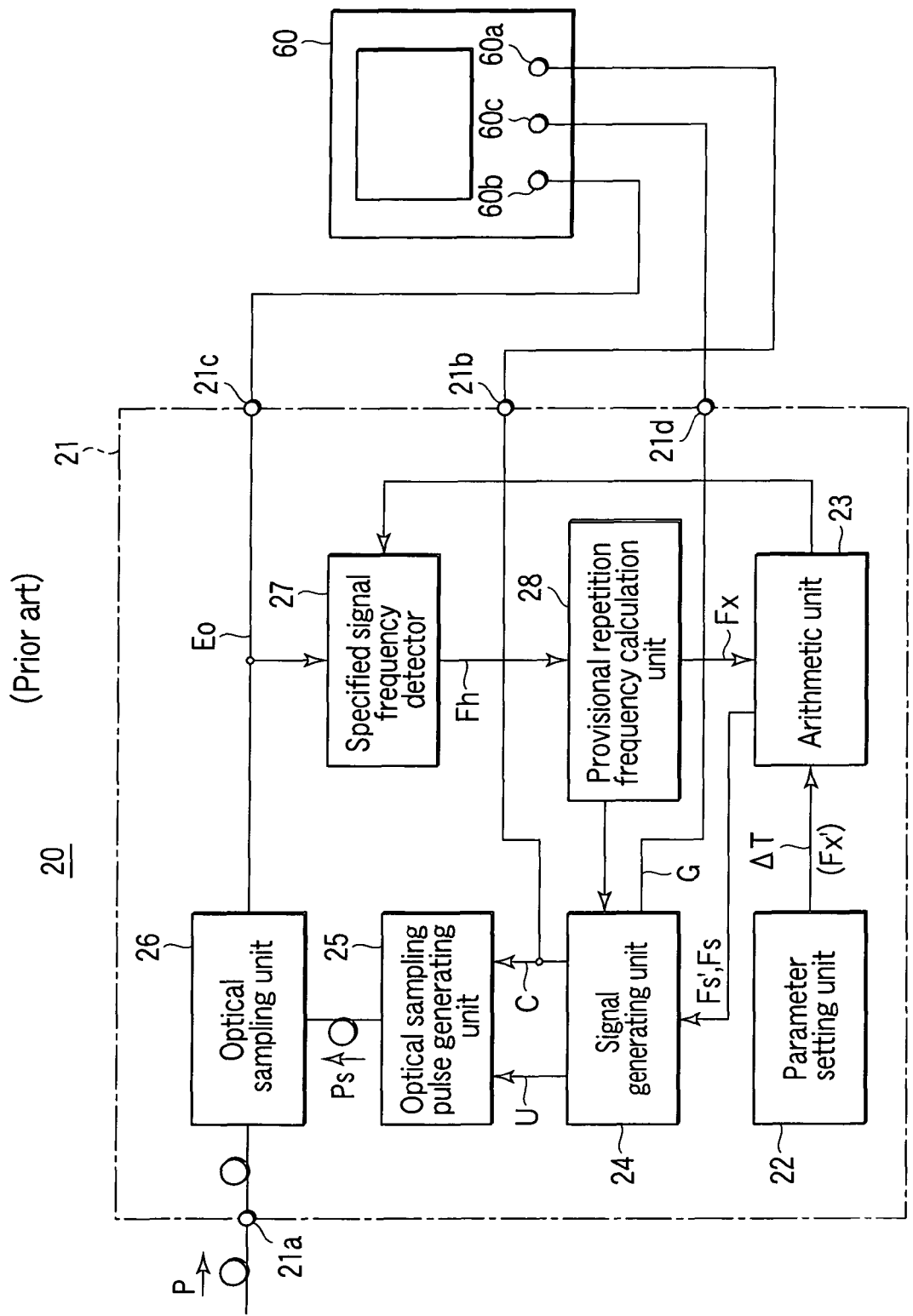
FIG. 15 is a block diagram shown for explaining the configuration of the waveform observation system including the measured-signal sampling apparatus according to the Japanese prior application filed by the present inventor.
Figure 16:
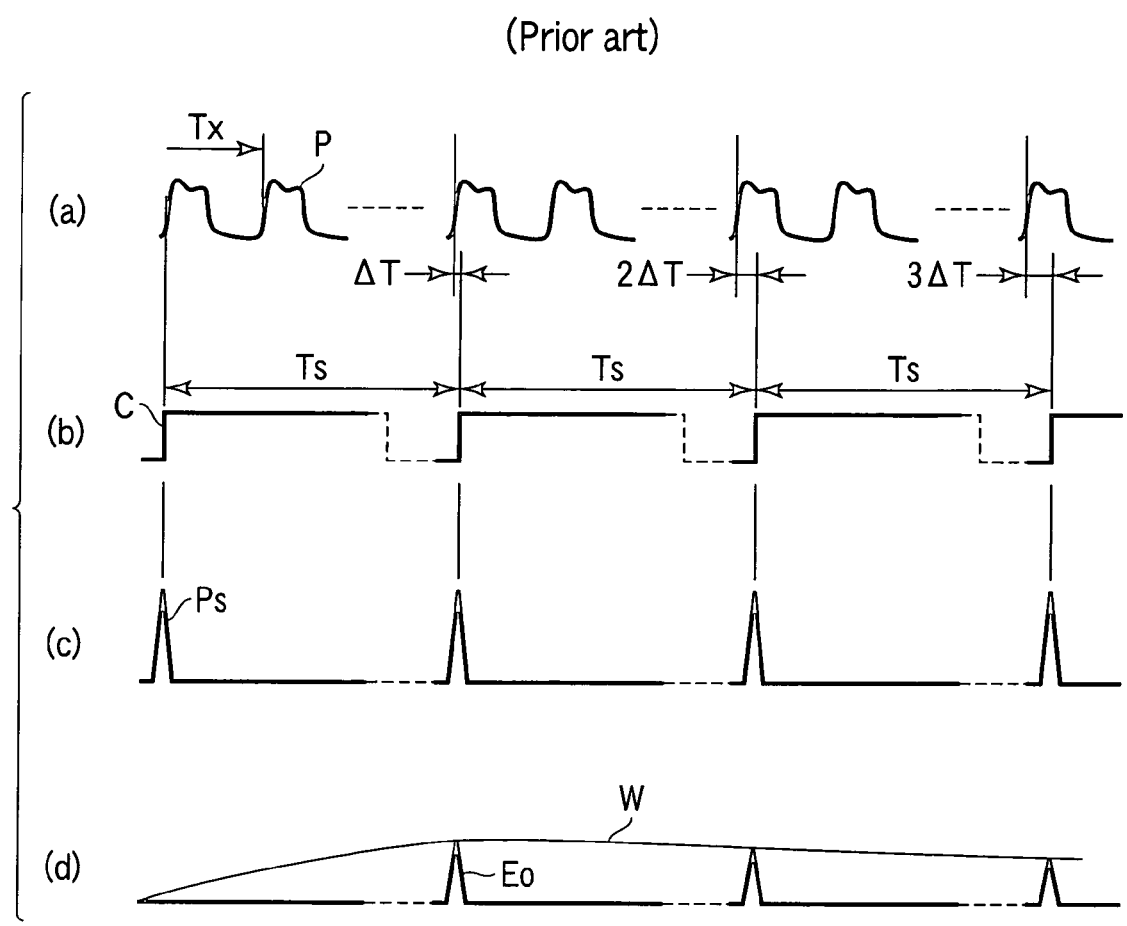
FIG. 16 is a diagram shown for explaining the operation of the essential parts of the waveform observation system including the measured-signal sampling apparatus according to the Japanese prior application filed by the present inventor.
Figure 18:
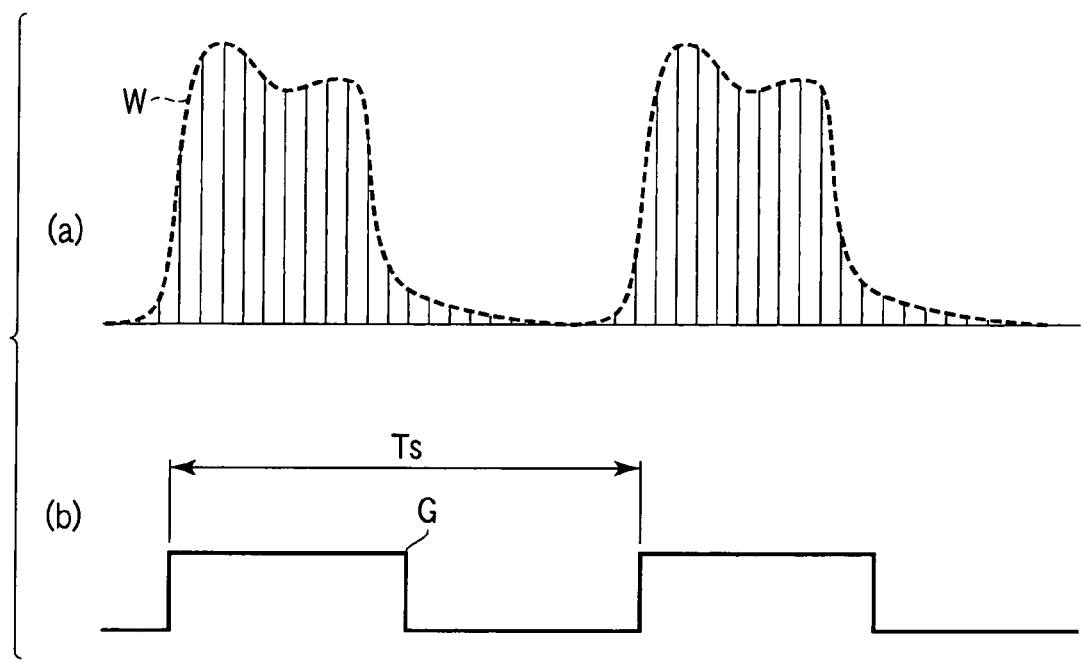
FIG. 18 is a diagram shown for explaining the operation of the essential parts of the waveform observation system including the measured-signal sampling apparatus according to the Japanese prior application filed by the present inventor.

This waveform observation system 20 according to the second embodiment, like the waveform observation system 20 including the measured-signal sampling apparatus similar to the Japanese prior application filed by the present inventor shown in FIG. 15, in order to execute steps S11 to S14 and S16 of the measured-signal repetition frequency detection method according to the first embodiment described above, specifically includes, as shown in FIG. 4, a parameter designation unit 22, an arithmetic unit 23, a signal generating unit 24, a sampling pulse generating unit 25, an optical sampling unit 26, a specified signal frequency detector 27 and a provisional repetition frequency calculation unit (in FIG. 15, the repetition frequency calculation unit) 28.

Also, the waveform observation system 20 according to the second embodiment, unlike the waveform observation system 20 including the measured-signal sampling apparatus different from the Japanese prior application filed by the present inventor shown in FIG. 15, in order to execute steps S15 and S17 to S20 of the measured-signal repetition frequency detection method according to the first embodiment described above, specifically includes, as shown in FIG. 4, a specified-signal frequency change amount detector 30, a sample number error calculation unit 31, a regular repetition frequency calculation unit 32, a sample number calculation unit 33 and a control unit 34.

The control unit 34 is for controlling a predetermined operation, described later, of the whole waveform observation system 20 according to the second embodiment.

Furthermore, in FIG. 4, those parts configured similarly to those of FIG. 15 described above are designated by the same reference numerals, respectively, and not explained again. Only the parts not explained in FIG. 15 will be explained below.

The parameter designation unit 22 is for designating the information corresponding to repetition period Tx of the waveform of the measured optical signal P and the sampling offset delay time $\Delta T$ by the operation of an operating unit (not shown). In the manual setting mode described above, an accurate repetition period Tx is designated, while in the auto setting mode, an approximate value Tx' is designated or nothing is designated.

Incidentally, this designation information may be either a period value or a corresponding frequency value or the information such as the number for designating one of preset values.

Also, in the case where one of the period and frequency of the signal is determined, the other thereof is uniquely specified. Therefore, the "period" and the relation thereof may be replaced by the "frequency" and the relation thereof, or conversely, the "frequency" and the relation thereof may be replaced with the "period" and the relation thereof.

The arithmetic unit 23, based on the information designated by the parameter designation unit 22 or the information obtained by the provisional repetition frequency calculation unit 28 described later, calculates the sampling period Ts (sampling frequency Fs) different by the offset delay time $\Delta T$ from an integer (N) multiple of the repetition period Tx (or an approximate value thereof) of the measured signal.

This arithmetic unit 23 calculates, as a trigger period Tg (frequency Fg), the time required to obtain, with the resolution of $\Delta T$, the data for one period of the waveform to be observed in the calculated sampling period.

Specifically, the provisional sampling frequency Fs (=1/Ts) can be determined by calculating $$Fs = Fx/(N + Fx \cdot \Delta T)$$

from the relation $Ts = N \cdot Tx + \Delta T$.

Also, the trigger frequency Fg, as described above, can be obtained by the calculation $$Fg = \text{mod}[Fx, Fs] = Fs \cdot Fx \cdot \Delta T$$

For example, assuming that Fx=1 GHz, $\Delta T$=0.1 ps and the range in which the sampling frequency Fs can be set is 10 MHz±1 kHz, an integer N is determined by which $10^9/(N + 10^9 \cdot 0.1 \times 10^{-12})$ is included in the range of 9.999 MHz to 10.001 MHz, and the frequency Fs satisfying the relation $Fs = Fx/(N + Fx \cdot \Delta T)$ with the particular value N is determined. In the aforementioned numerical example, the values of N=100, and Fs=9.99999 MHz are obtained.

Also, $Fx/Fs = N + Fx \cdot \Delta T$ and therefore, assuming that the remainder after dividing Fx by Fs is D, $$D/Fs = Fx \cdot \Delta T (<1)$$

As a result, the remainder D is given as $$D = Fs \cdot Fx \cdot \Delta T$$

Thus, the trigger frequency Fg for the aforementioned numerical example is $$Fg = 9.99999 \times 10^6 \cdot 1 \times 10^9 \cdot 0.1 \times 10^{-12}$$
$$= 9.99999 \times 10^2 \text{ (Hz)}$$

The signal generating unit 24 generates and outputs a clock signal C of the sampling frequency Fs calculated in the arithmetic unit 23, a signal U of a high frequency required for the optical sampling pulse generating unit 25 described later to generate a pulse light having a narrow width and a trigger signal G of the frequency Fg.

The configuration of this signal generating unit 24 is so arbitrary as to generate, for example, the signal U by multiplying a stable, very accurate reference signal (for example, 1 GHz±1 MHz) and the clock signal C and the trigger signal G by dividing the frequency of the signal U.

The optical sampling pulse generating unit 25 generates an optical sampling pulse Ps with a period equal to that of the clock signal C output from the signal generating unit 24.

The pulse width of the optical sampling pulse Ps generated by this optical sampling pulse generating unit 25 determines the upper limit of the sampling time resolution, and the narrower pulse width can be obtained the higher time resolution for sampling.

Figure 5:
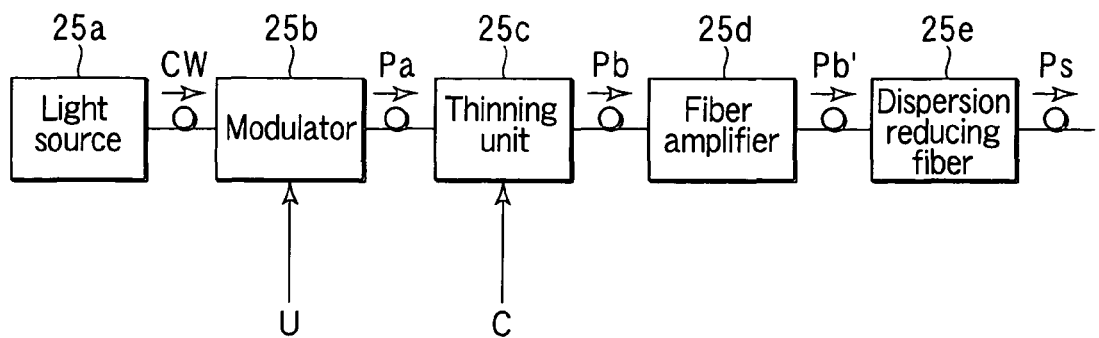
FIG. 5 is a block diagram showing an example of the configuration of the essential parts of the waveform observation system including the measured-signal sampling apparatus according to the second embodiment of the invention.
Figure 6:
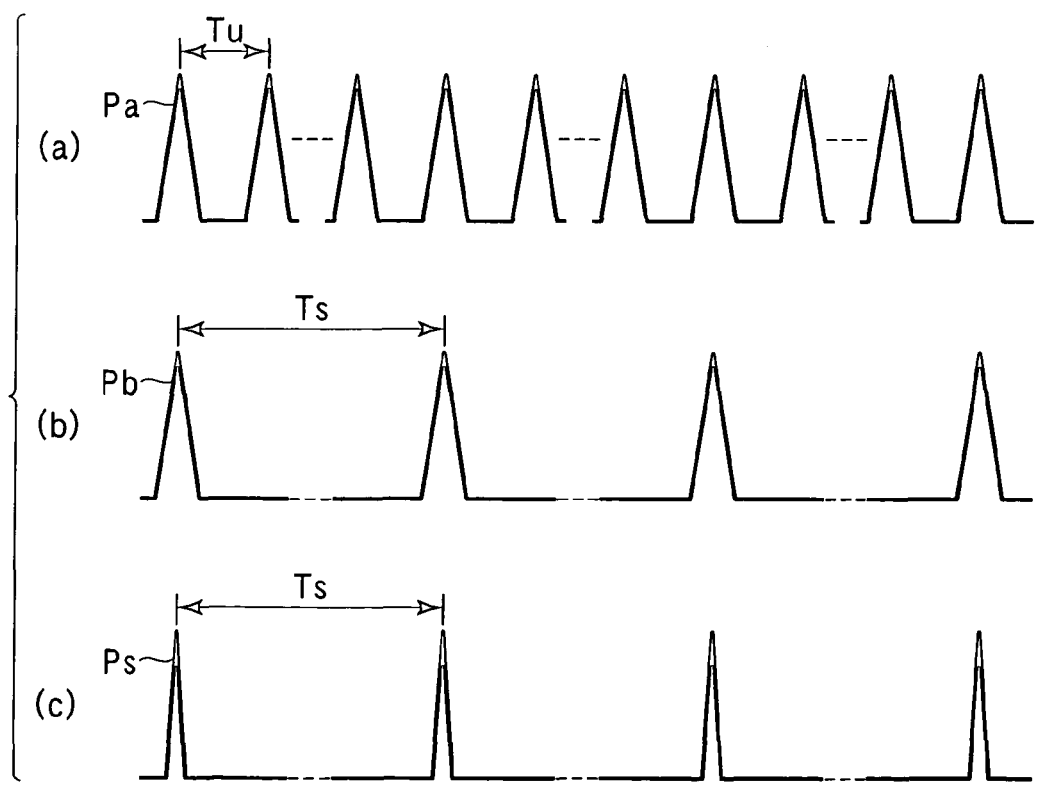
FIG. 6 is a diagram shown for explaining the operation of the essential parts of the waveform observation system including the measured-signal sampling apparatus according to the second embodiment of the invention.
Figure 12:
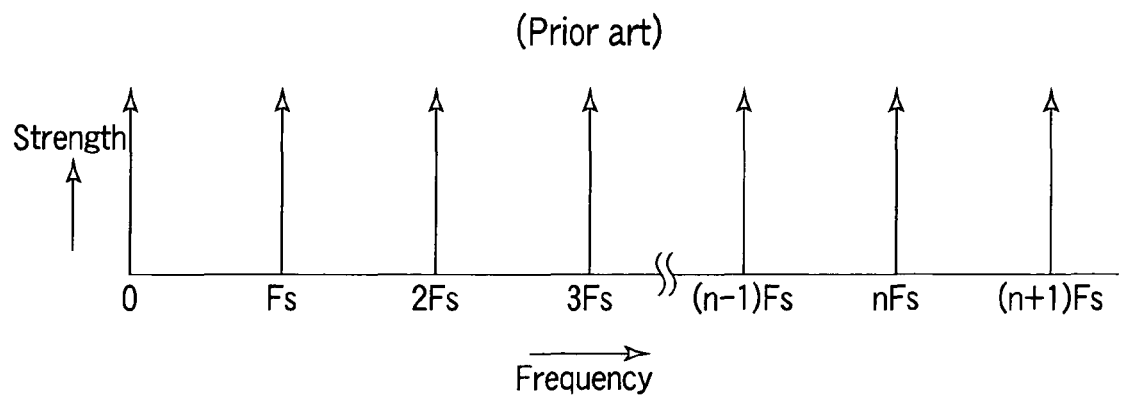
FIG. 12 is a diagram shown for explaining the principle of the measured-signal repetition frequency detection method according to the Japanese prior application filed by the present inventor.
Figure 13:
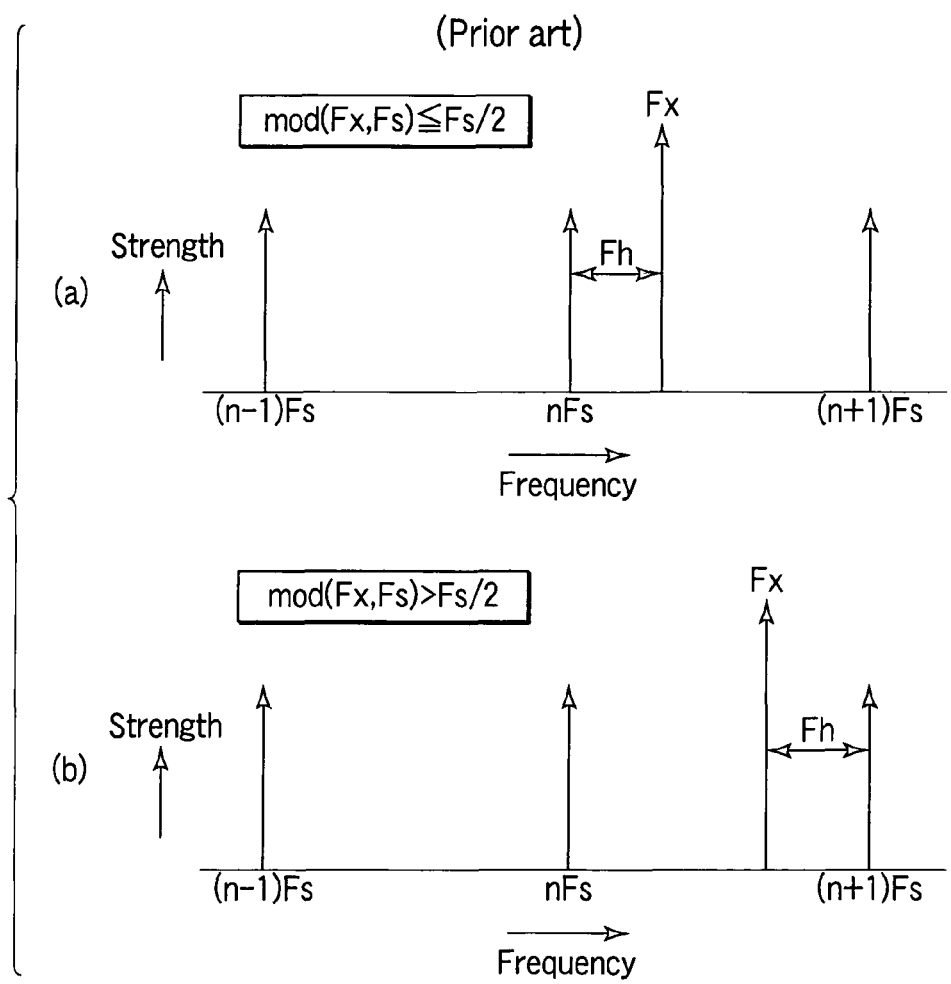
FIG. 13 is a diagram shown for explaining the principle of the measured-signal repetition frequency detection method according to the Japanese prior application filed by the present inventor.

In order to obtain this narrow optical sampling pulse, the optical sampling pulse generating unit 25, as shown in FIG. 5, for example, is such that continuous light CW emitted from a light source 25a enters a modulator 25b and is modulated by the modulator 25b with the signal U, and as shown in FIG. 6A, the pulse light Pa having a comparatively narrow width is generated with the period Tu of the signal U, which pulse light Pa is input to a thinning unit 25c.

The thinning unit 25c has an optical switch adapted to be turned on only for a short time with the period of the clock signal C, and as shown in FIG. 6B, outputs the pulse light Pb having the period Ts of the clock signal C.

This pulse light Pb is input to a fiber amplifier 25d of automatic gain control type, and after being amplified to a pulse light Pb' of proper strength, enters a dispersion reducing fiber 25e.

From the dispersion reducing fiber 25e that has received the pulse light Pb' of proper strength, as shown in FIG. 6C, an optical sampling pulse Ps having a narrow width (for example, 0.1 ps or less) is emitted with the period Ts.

Incidentally, the optical sampling pulse Ps emitted from this optical sampling pulse generating unit 25 is set in synchronism with the clock signal C.

According to this embodiment, the optical sampling pulse generating unit 25 selectively generates a first sampling pulse synchronized with the clock signal C from the signal generating unit 24 under the control of the control unit 34 and having a provisional sampling frequency Fs as first to third sampling frequencies in accordance with the aforementioned designation, a second sampling pulse having a sampling frequency changed from the provisional sampling frequency Fs by a minuscule frequency ΔFs not generating the frequency fold at the time of sampling, and a third sampling pulse having a sampling frequency changed from the provisional sampling frequency Fs by a large frequency dFs to generate the frequency fold at the time of sampling.

In this case, the optical sampling pulse Ps as the first to third sampling pulses selectively generated enter the optical sampling unit 26.

The optical sampling unit 26, as shown in FIG. 7, for example, includes an optical mixer 26a and a photoelectric converter 26b, inputs the optical signal P and the optical sampling pulse Ps input from the input terminal 21a to the optical mixer 26a, and samples the measured optical signal P with the optical sampling pulse Ps, so that the pulse light Po obtained by the sampling is output by being converted into an electrical pulse signal Eo by the photoelectric converter 26b.

The specified signal frequency detector 27, together with the repetition frequency calculation unit 28 described later, under the control of the control unit 34, operates upon designation of the auto setting mode, and by receiving the pulse signal Eo output after being sampled with the first sampling pulse from the optical sampling unit 26, detects the frequency Fh of the specified signal appearing in the band not more than one half of the sampling frequency among the signal components contained in the pulse signal Eo.

This specified signal frequency detector 27, as shown in FIG. 8, for example, inputs the pulse signal Eo to an A/D converter 27a where it is converted to a digital value, and the resulting digital value string is subjected to the band limiting process of not more than one half of the sampling frequency through a digital filter 27b. Further, through an arithmetic processing unit 27c, the process such as FFT (fast Fourier transform) process is executed and the signal component highest in level is determined as a specified signal with the frequency Fh thereof.

The provisional repetition frequency calculation unit 28, upon designation of the auto setting mode, controls the signal generating unit 24 under the control of the control unit 34, and determines a frequency change amount ΔFh of the specified signal output by being sampled with the second sampling pulse changed by a minuscule frequency ΔFs from the provisional sampling frequency Fs as a sampling frequency for the measured optical signal P. Then, based on this change amount, the provisional repetition frequency Fx' of the measured optical signal P is determined and set in the arithmetic unit 23.

The specified signal frequency change amount detector 30 detects the frequency change amount dFh_meas of the specified signal obtained in the case where the measured signal is sampled by the sampling unit 26 with the third sampling pulse from the sampling pulse generating unit 25.

The sample number error calculation unit 31 calculates the error en contained in the sample number n with a frequency fluctuation contained in the measured signal, based on the frequency change amount dFh_meas of the specified signal detected by the specified signal frequency change amount detector 30 and the change amount dn of the sample number n indicating how many times the frequency fold has occurred in the process.

The regular repetition frequency calculation unit 32 corrects the provisional repetition frequency Fx' of the measured signal calculated by the provisional repetition frequency calculation unit 28, based on the error en contained in the sample number n calculated by the sample number error calculation unit 31 thereby to calculate the regular repetition frequency Fx of the measured signal.

The sample number calculation unit 33 calculates the sample number n given from Equation (1):

$$n = \Delta Fh/\Delta Fs \quad (1)$$

having, as the denominator, the minuscule frequency ΔFs used in the provisional repetition frequency calculation unit 28 and, as the numerator, the frequency change amount ΔFh used in the provisional repetition frequency calculation unit 28.

The measured-signal sampling apparatus according to the invention is characterized by basically including an input terminal 21a which inputs a measured signal; a signal generating unit 24 which selectively generates a clock signal of first to third sampling frequencies in accordance with a designation; a sampling pulse generating unit 25 which selectively generates, as the first to third sampling frequencies synchronized with the clock signal from the signal generating unit 24 and in accordance with the designation, a first sampling pulse having a provisional sampling frequency, a second sampling pulse having a sampling frequency changed from the provisional sampling frequency Fs by a minuscule frequency ΔFs not generating the frequency fold at the time of sampling and a third sampling pulse having a sampling frequency changed from the provisional sampling frequency Fs by such a large frequency dFs as to generate the frequency fold at a time of sampling; a sampling unit 26 which selectively samples the measured signal with the first to third sampling pulses from the sampling pulse generating unit 25; a specified signal frequency detector 27 which detects the frequency Fh of the specified signal appearing in the band not more than one half of the provisional sampling frequency Fs among those signals obtained in the case where the measured signal is sampled by the sampling unit 26 with the first sampling pulse from the sampling pulse generating unit 25; a frequency change amount calculation unit 29 which calculates the frequency change amount ΔFh of the specified signal detected by the specified signal frequency detector 27 at a time of sampling the measured signal by the sampling unit 26 with the second sampling pulse from the sampling pulse generating unit 25; a provisional repetition frequency calculation unit 28 which calculates the provisional repetition frequency Fx' of the measured signal based on the provisional sampling frequency Fs generated by the sampling pulse generating unit 25, the minuscule frequency ΔFs as a change amount of the sampling frequency, the frequency Fh of the specified signal for the provisional sampling frequency Fs detected by the specified signal frequency detector 27 and the frequency change amount ΔFh of the specified signal calculated by the frequency change amount calculation unit 29; a sample number calculation unit 33 which calculates the sample number n from Equation (1) below:

$$n = \Delta Fh / \Delta Fs \quad (1)$$

where a denominator is the minuscule frequency ΔFs used in the provisional repetition frequency calculation unit 28 and a numerator is the frequency change amount ΔFh used in the provisional repetition frequency calculation unit 28; a specified signal frequency change amount detector 30 which detects the frequency change amount dFh of the specified signal obtained in the case where the measured signal is sampled sequentially by the sampling unit 26 with the third sampling pulse from the sampling pulse generating unit 25; a sample number error calculation unit 31 which calculates the error en contained in the sample number n with a frequency fluctuation contained in the measured signal, based on the frequency change amount dFh of the specified signal measured by the specified signal frequency change amount detector 30 and the change amount dn of the sample number n calculated by the sample number calculation unit 33 indicating how many times the frequency fold has occurred in the process; and a regular repetition frequency calculation unit 32 which calculates the regular repetition frequency Fx of the measured signal by correcting the provisional repetition frequency Fx' of the measured signal calculated by the provisional repetition frequency calculation unit 28 based on the error en contained in the sample number n calculated by the sample number error calculation unit 31.

The specified signal frequency detector 27 causes the sampling pulse generating unit 25 to generate the first sampling pulse having a provisional sampling frequency by designating, for the signal generating unit 24, the provisional sampling frequency having the repetition frequency Fs as the first sampling frequency in accordance with the designation and detects the frequency Fh of the specified signal appearing in the band Fs/2 not more than one half of the given repetition frequency Fs among the signals obtained in the case where the measured signal is sampled by the sampling unit 26 with the first sampling pulse having the provisional sampling frequency on the other hand.

The frequency change amount calculation unit 29 causes the sampling pulse generating unit 25 to generate the second sampling pulse by designating, for the signal generating unit 24, a sampling frequency having the frequency changed from the given repetition frequency Fs by a minuscule frequency ΔFs not generating the frequency fold at the time of sampling as the second sampling frequency corresponding to the designation on the one hand and calculates the frequency change amount ΔFh of the specified signal obtained in the case where the measured signal is sampled by the sampling unit 26 with the second sampling pulse.

The provisional repetition frequency calculation unit 28 calculates the provisional repetition frequency Fx' of the measured signal from Equation (2) below:

$$Fx' = Fh - Fs \cdot \Delta Fh / \Delta Fs \ldots \text{(in the case where } 0 > \Delta Fh / \Delta Fs)$$

$$Fx' = -Fh + Fs \cdot \Delta Fh / \Delta Fs \ldots \text{(in the case where } 0 < \Delta Fh / \Delta Fs) \quad (2)$$

based on the provisional sampling frequency Fs from the sampling pulse generating unit 25, the minuscule frequency ΔFs as a change amount of the sampling frequency, the frequency Fh of the specified signal for the provisional sampling frequency Fs detected by the specified signal frequency detector 27 and the frequency change amount ΔFh of the specified signal calculated by the frequency change amount calculation unit 29.

The specified signal frequency change amount detector 30 causes the sampling pulse generating unit 25 to generate the third sampling pulse by designating, for the signal generating unit 24, the sampling frequency changed from the given repetition frequency Fs by such a large frequency dFs as to generate the frequency fold at the time of sampling as the third sampling frequency corresponding to the designation on the one hand and detects the frequency change amount dFh_meas of the specified signal in the case where the measured signal is sampled sequentially with the third sampling pulse by the sampling unit 26 on the other hand, thus calculating the change amount dn of the sample number n from Equation (3):

$$dFh\_target = dn \cdot (Fs + dFs) + n \cdot dFs \quad (3)$$

(where dFh_target is a target value of the frequency change amount of the specified signal due to the large change in the sampling frequency, and an arbitrary frequency determined within the range of 0 to dFs/2, where n is the sample number calculated by the sample number calculation unit 33, dn is the change amount of the sample number n due to the large change in the sampling frequency, and the large change amount dFs of the sampling frequency is determined in such a manner as to be established within the range of the frequency fluctuation estimated to be contained in the measured signal).

The sample number error calculation unit 31, assuming that the frequency change amount dFh_meas of the specified signal detected by the specified signal frequency change amount detector 30 is expressed by Equation (4):

$$dFh\_meas = dn \cdot (Fs + dFs) + (n + en) \cdot dFs \quad (4)$$

(where en is the error contained in the sample number n), calculates the error en contained in the sample number n according to Equation (5) obtained from the difference between Equations (3) and (4):

$$en = (dFh\_meas - dFh\_target) / dFs \quad (5)$$

In the regular repetition frequency calculation unit 32, the error en contained in the sample number n calculated by the sample number error calculation unit 31 is added to the sample number n calculated by the sample number calculation unit 33 thereby to obtain an accurate sample number n+en, which is reflected in Equation (2) as ΔFh/ΔFs indicating the sample number n. By thus correcting the provisional repetition frequency Fx' of the measured signal calculated by Equation (2), the regular repetition frequency Fx of the measured signal is calculated.

In the arithmetic unit 23, the frequency Fs corresponding to the period Ts different by a predetermined offset delay time ΔT from an integer multiple of the repetition period Tx corresponding to the regular repetition frequency Fx calculated by the regular repetition frequency calculation unit 32 is calculated as the regular sampling frequency for the measured signal, and by designating the calculated regular sampling frequency for the signal generating unit 24, the sampling pulse having the regular sampling frequency is generated in place of the first to third sampling pulses from the sampling pulse generating unit 25, so that the measured signal can be sampled by the sampling unit 26 with the sampling pulse having the regular sampling frequency.

The pulse signal Eo output by sampling the measured signal by the sampling unit 26 with the sampling pulse having the regular sampling frequency Fs is retrieved by and displayed on the digital oscilloscope 60 in a similar manner to FIG. 15 described above.

Specifically, in the measured-signal sampling apparatus and the waveform observation system according to the invention, the sampling frequency for the measured signal of an unknown frequency is accurately set using the measured-signal frequency detection method according to the first embodiment described above. Even in the presence of a frequency fluctuation in the measured signal, therefore, the measured signal can be sampled with high accuracy while at the same time making it possible to observe the waveform of the measured signal with high accuracy.

Third Embodiment

FIG. 9 is a block diagram shown for explaining the configuration of a waveform observation system including a measured-signal sampling apparatus according to a third embodiment of the invention.

A waveform observation system 40 including the measured-signal sampling apparatus according to the third embodiment has such a configuration that the sampling apparatus 21 included in the waveform observation system 20 according to the second embodiment and the function of the digital oscilloscope 60 are accommodated in the same housing and integrated with each other.

Specifically, the waveform observation system 40 including the measured-signal sampling apparatus according to the third embodiment includes, in addition to each component element of the sampling apparatus 21 shown in FIG. 4 above, an A/D converter 43, a data acquisition control unit 44, a waveform data memory 45, a display control unit 46, a display unit 47 and an observation mode designation unit 48.

The A/D converter 43 executes the A/D conversion process for the pulse signal Eo output from the optical sampling unit 26 each time it receives a clock signal C (or a faster clock signal synchronized with the clock signal C), and data Dp of the peak value of the pulse signal Eo obtained by the A/D conversion process is output to the data acquisition control unit 44.

The data acquisition control unit 44 begins to write the data Dp in the waveform data memory 45 in synchronism with the clock signal C from the rise (or fall) timing of the trigger signal G, and after writing a predetermined number of data, waits for the next rise of the trigger signal G. This operation is repeated.

Incidentally, the number of the data written in the waveform data memory 45 corresponds to the number of the display points along the time axis displayed on the display unit 47 described later.

The display control unit 46, forming a waveform display unit with the display unit 47, displays the coordinate screen including the time axis and the voltage axis on the display unit 47, reads a series of data Dp stored in the waveform data memory 45 and displays by plotting them on the coordinate screen, and displays a waveform corresponding to the series of the data Dp that have been read.

The display control unit 46, in accordance with the observation mode designated by the observation mode designation unit 48, processes and displays the data Dp stored in the waveform data memory 45.

Specifically, in the case where the persistence mode is designated, the waveform is displayed while leaving the after-image of the series of the data Dp stored in the waveform data memory 45, and in the case where the averaging mode is designated, a predetermined number of sets of the series of the data Dp stored in the waveform data memory 45 are acquired and averaged out, so that the series of the data obtained by the averaging process are superposed and displayed as a waveform.

The operation of the waveform observation system 40 configured this way is similar to that of the waveform observation system 20 described above. Thus, the repetition frequency of the measured optical signal is accurately determined, and even in the presence of a frequency fluctuation of the repetition frequency of the measured optical signal, the sampling frequency and the trigger frequency corresponding to the particular repetition frequency are set, so that even the waveform of which the repetition frequency is unknown or only approximately known can be displayed in stable fashion.

Incidentally, in the case where the waveform information of the measured signal is sporadically acquired and displayed, the periodic trigger signal G described above is not required to be generated, but a trigger signal G rising only once in accordance with the manual trigger operation is output.

By sampling the measured signal with different sampling frequencies, the regular repetition frequency of the measured optical signal can be obtained like in the aforementioned case even in the presence of a frequency fluctuation in the repetition frequency of the measured optical signal, and by setting the sampling frequency in exact correspondence with the accurate repetition frequency and performing the trigger operation described above, the waveform of the measured signal can be accurately displayed.

Also, in the case where the waveform observation system 40 has the display function as described above, the spectrum of the measured signal can also be displayed.

In this case, the specified signal frequency detector 27 detects the frequency and the level of a plurality of specified signals appearing in the band not more than one half of the sampling frequency and outputs it to the provisional repetition frequency calculation unit 28.

Also, the provisional repetition frequency calculation unit 28 acquires the spectrum of a plurality of frequency components contained in the measured signal, based on each frequency change amount for a plurality of the specified signals detected by the specified signal frequency detector 27 and outputs it to the waveform display control unit 46 through the regular repetition frequency calculation unit 32 as indicated by dashed line in FIG. 9.

As long as the auto setting mode is designated, the waveform display control unit 46 displays, on the frequency axis of the display unit 47, the spectrum obtained from the provisional repetition frequency calculation unit 28 through the regular repetition frequency calculation unit 32.

Also, in the waveform observation systems 20, 40 described above, the invention is applicable with equal effect to the E/O sampling method for sampling the electrical signal with an optical pulse in place of the O/O sampling method for sampling the optical signal with an optical pulse.

The measured-signal waveform observation system according to the third embodiment of the invention is characterized by basically including an input terminal 21a which inputs the measured signal; a signal generating unit 24 which selectively generates the clock signal of first to third sampling frequencies in accordance with a designation and a fourth sampling frequency corresponding to the designation; a sampling pulse generating unit 25 which selectively generates, among the first to third sampling frequencies synchronized with the clock signal from the signal generating unit 24 and in accordance with the designation, a first sampling pulse having a provisional sampling frequency Fs, a second sampling pulse having a sampling frequency changed from the provisional sampling frequency Fs by a minuscule frequency $\Delta Fs$ not generating the frequency fold at the time of sampling, a third sampling pulse having a sampling frequency changed from the provisional sampling frequency Fs by a large frequency dFs to generate the frequency fold at the time of sampling and a fourth sampling pulse having a fourth sampling frequency in accordance with the designation; a sampling unit 26 which selectively samples the measured signal with the first to third sampling pulses and the fourth sampling pulse from the sampling pulse generating unit 25; a specified signal frequency detector 27 which detects the frequency Fh of the specified signal appearing in the band not more than one half of the provisional sampling frequency Fs among those signals obtained in the case where the measured signal is sampled by the sampling unit 26 with the first sampling pulse from the sampling pulse generating unit 25; a frequency change amount calculation unit 29 which calculates the frequency change amount ΔFh of the specified signal obtained at the time of sampling the measured signal by the sampling unit 26 with the second sampling pulse from the sampling pulse generating unit 25; a provisional repetition frequency calculation unit 28 which calculates the provisional repetition frequency Fx' of the measured signal based on the provisional sampling frequency Fs generated by the sampling pulse generating unit 25, the minuscule frequency ΔFs as a change amount of the sampling frequency, the frequency Fh of the specified signal for the provisional sampling frequency Fs detected by the specified signal frequency detector 27 and the frequency change amount ΔFh of the specified signal calculated by the frequency change amount calculation unit 29; a sample number calculation unit 33 which calculates the sample number n from Equation (1) below:

$$n = \Delta Fh/\Delta Fs \quad (1)$$

where the denominator is the minuscule frequency ΔFs used in the provisional repetition frequency calculation unit 28 and the numerator is the frequency change amount ΔFh used in the provisional repetition frequency calculation unit 28; a specified signal frequency change amount detector 30 which detects the frequency change amount dFh of the specified signal obtained in the case where the measured signal is sampled by the sampling unit 26 with the third sampling pulse from the sampling pulse generating unit 25; a sample number error calculation unit 31 which calculates the error en contained in the sample number n with a frequency fluctuation contained in the measured signal, based on the frequency change amount dFh of the specified signal detected by the specified signal frequency change amount detector 30 and the change amount dn of the sample number n calculated by the sample number calculation unit 33 and indicating how many times the frequency fold has occurred in the process; a regular repetition frequency calculation unit 32 which calculates the regular repetition frequency Fx of the measured signal by correcting the provisional repetition frequency Fx' of the measured signal calculated by the provisional repetition frequency calculation unit 28 based on the error en contained in the sample number n calculated by the sample number error calculation unit 31; an arithmetic unit 23 which calculates, as a regular sampling frequency for the measured signal, the frequency Fs corresponding to the period Ts different by a predetermined offset delay time ΔT from an integer multiple of the repetition period Tx corresponding to the regular repetition frequency Fx calculated by the regular repetition frequency calculation unit 32, and by designating the calculated regular sampling frequency Fs as the fourth sampling frequency for the signal generating unit 24, generates the fourth sampling pulse from the sampling pulse generating unit 25 while at the same time causing the sampling unit 26 to sample the measured signal with the fourth sampling pulse; an analog/digital (A/D) converter 43 which outputs by converting the signal sampled with the fourth sampling pulse and output from the sampling unit 26 into the digital waveform data; a waveform data memory 45 which stores the waveform data output from the A/D converter 43; a data acquisition control unit 44 which writes the waveform data output from the A/D converter 43 into the waveform data memory 45 in synchronism with the clock signal from the signal generating unit 24; and a display control unit 46 which reads a series of waveform data stored in the waveform data memory 45 and displays the waveform data at intervals corresponding to the offset delay time on the time axis of the display unit 46.

The specified signal frequency detector 27, by designating a provisional sampling frequency having a given repetition frequency Fs as the first sampling frequency in accordance with the designation for the signal generating unit 24, causes the sampling pulse generating unit 25 to generate the first sampling pulse having the provisional sampling frequency and detects the frequency Fh of the specified signal appearing in the band Fs/2 not more than one half of the given repetition frequency Fs among the signals obtained in the case where the measured signal is sampled by the sampling unit 26 with the first sampling pulse having the provisional sampling frequency.

The frequency change amount calculation unit 29, by designating, for the signal generating unit 24, the sampling frequency changed from the given repetition frequency Fs by a minuscule frequency ΔFs not generating the frequency fold at the time of sampling as the second sampling frequency corresponding to the designation, causes the sampling pulse generating unit 25 to generate the second sampling pulse while at the same time calculating the frequency change amount ΔFh of the specified signal obtained in the case where the measured signal is sampled by the sampling unit 26 with the second sampling pulse.

The provisional repetition frequency calculation unit 28 calculates the provisional repetition frequency Fx' of the measured signal from Equation (2) below:

$$Fx' = Fh - Fs \cdot \Delta Fh / \Delta Fs \ldots \text{(in the case where } 0 > \Delta Fh/\Delta Fs\text{)}$$

$$Fx' = -Fh + Fs \cdot \Delta Fh / \Delta Fs \ldots \text{(in the case where } 0 < \Delta Fh/\Delta Fs\text{)} \quad (2)$$

based on the provisional sampling frequency Fs from the sampling pulse generating unit 25, the minuscule frequency ΔFs as a change amount of the sampling frequency, the frequency Fh of the specified signal for the provisional sampling frequency Fs detected by the specified signal frequency detector 27 and the frequency change amount ΔFh of the specified signal calculated by the frequency change amount calculation unit 29.

The specified signal frequency change amount detector 30 causes the sampling pulse generating unit 25 to generate the third sampling pulse by designating, for the signal generating unit, a sampling frequency changed from the given repetition frequency Fs by a large frequency dFs to generate the frequency fold at the time of sampling as the third sampling frequency corresponding to the designation and detects the frequency change amount dFh_meas of the specified signal obtained in the case where the measured signal is sampled by the sampling unit 26 with the third sampling pulse, thus calculating the change amount do of the sample number n from Equation (3):

$$dFh\_target = dn \cdot (fs + dFs) + n \cdot dfs \quad (3)$$

(where dFh_target is a target value of the frequency change amount of the specified signal due to the large change in the sampling frequency and an arbitrary frequency determined within the range of 0 to dFs/2, n is the sample number calculated by the sample number calculation unit 33, dn is the change amount of the sample number n due to the large change in the sample frequency, and the large change amount dFs of the sampling frequency is determined in such a manner as to be established within the range of the frequency fluctuation estimated to be contained in the measured signal).

The sample number error calculation unit 31, assuming that the frequency change amount dFh_meas of the specified signal detected by the specified signal frequency change amount detector 30 is expressed by Equation (4):

$$dFh\_meas = dn \cdot (Fs+dFs) + (n+en) \cdot dFs \quad (4)$$

(where en is the error contained in the sample number n), calculates the error en contained in the sample number n according to Equation (5) obtained from the difference between Equations (3) and (4):

$$en = (dFh\_meas - dFh\_target)/dFs \quad (5)$$

In the regular repetition frequency calculation unit 32, the error en contained in the sample number n calculated by the sample number error calculation unit 31 is added to the sample number n calculated by the sample number error calculation unit 33 thereby to obtain an accurate sample number n+en, which is reflected in Equation (2) as ΔFh/ΔFs indicating the sample number n, and by thus correcting the provisional repetition frequency Fx' of the measured signal calculated in Equation (2), the regular repetition frequency Fx of the measured signal is calculated.

The specified signal frequency detector 27 is configured to detect the frequency of each of a plurality of specified signals appearing in the band not more than one half of the first sampling frequency, and the provisional repetition frequency calculation unit 28 is configured to, based on the frequency change amount of the plurality of the specified signals detected by the specified signal frequency detector 27, acquire the spectrum of the plurality of the frequency components contained in the measured signal. Also, the display control unit 47 is configured in such a manner that the spectrum obtained by the provisional repetition frequency calculation unit 28 is displayed on the frequency axis of the display unit 46 through the regular repetition frequency calculation unit 32.

Specifically, in the measured-signal sampling apparatus and the waveform observation system 40 according to the third embodiment of the invention, like in the measured-signal sampling apparatus and the waveform observation system 20 according to the second embodiment described above, the sampling frequency for the measured signal having an unknown frequency is set accurately using the measured-signal repetition frequency detection method according to the first embodiment. Even in the presence of a frequency fluctuation in the measured signal, therefore, the measured signal can be sampled with high accuracy while at the same time making it possible to observe the waveform of the measured signal with high accuracy.

As a result, according to the invention, as described in detail above, there are provided a measured-signal repetition frequency detection method capable of accurately detecting the repetition frequency of the measured signal from the sampling result even in the presence of a frequency fluctuation in the measured signal and a sampling apparatus and a waveform observation system which can be stably acquired and observed the waveform information using the method while at the same time making it possible to configure the whole system simply.

The invention claimed is:

1. A measured-signal repetition frequency detection method comprising:
   a first stage for detecting a frequency Fh of a specified signal appearing in a band not more than one half of a provisional sampling frequency Fs among signals obtained by sampling a measured signal with the provisional sampling frequency Fs;
   a second stage for calculating a frequency change amount ΔFh of the specified signal obtained with a sampling frequency changed from the provisional sampling frequency Fs by a minuscule frequency ΔFs not generating a frequency fold at a time of sampling;
   a third stage for calculating a sample number n from Equation (1):

$$n = \Delta Fh/\Delta Fs \quad (1)$$

where a denominator is the minuscule frequency ΔFs in the second stage and a numerator is the frequency change amount ΔFh of the specified signal in the second stage;
   a fourth stage for calculating a provisional repetition frequency Fx' of the measured signal based on the provisional sampling frequency Fs, the frequency Fh of the specified signal for the provisional sampling frequency Fs, the minuscule frequency ΔFs as a change amount of the sampling frequency and the frequency change amount ΔFh of the specified signal;
   a fifth stage for detecting a frequency change amount dFh_meas of the specified signal obtained in the case where the measured signal is sampled with a sampling frequency changed greatly from the provisional sampling frequency Fs so as to generate the frequency fold at a time of sampling and calculating an error en contained in the sample number n calculated in the third stage with a frequency fluctuation contained in the measured signal, based on a detected frequency change amount dFh_meas of the specified signal and a change amount dn of the sample number n calculated in the third stage indicating how many times the frequency fold has occurred in this process; and
   a sixth stage for calculating a regular repetition frequency Fx of the measured signal by correcting the provisional repetition frequency Fx' of the measured signal calculated in the fourth stage based on the error en contained in the sample number n calculated in the fifth stage.

2. The measured-signal repetition frequency detection method according to claim 1,
   wherein the first stage is such that among the signals obtained by sampling the measured signal with the sampling frequency having a given repetition frequency Fs as the provisional sampling frequency, a frequency Fh of the signal indicating a maximum level is measured as the specified signal appearing in a band not more than one half of the given repetition frequency Fs.

3. The measured-signal repetition frequency detection method according to claim 2,
   wherein the fourth stage is such that the provisional repetition frequency Fx' of the measured signal is calculated from Equation (2):

$$Fx' = Fh - Fs \cdot \Delta Fh/\Delta Fs \ldots \text{(in the case where } 0 > \Delta Fh/\Delta Fs)$$

$$Fx' = -Fh + Fs \cdot \Delta Fh/\Delta Fs \ldots \text{(in the case where } 0 < \Delta Fh/\Delta Fs) \quad (2)$$

based on the frequency Fh of the signal indicating the maximum level as the specified signal appearing in the band Fs/2 not more than one half of the given repetition frequency Fs detected in the first stage and the frequency change amount ΔFh of the specified signal obtained in the case where the measured signal is sampled with the given repetition frequency Fs changed by the minuscule frequency ΔFs not generating the frequency fold at a time of sampling as the provisional sampling frequency measured in the second stage.

4. The measured-signal repetition frequency detection method according to claim 3, wherein the fifth stage is such that the frequency change amount dFh_meas of the specified signal is detected as obtained in the case where the measured signal is sampled with the sampling frequency changed from the given repetition frequency Fs as the provisional sampling frequency in the first stage by as great as the frequency dFs to generate the frequency fold at a time of sampling, the change amount dn of the sample number n is calculated from Equation (3):

$$dFh\_target=dn\cdot(Fs+dFs)+n\cdot dFs \quad (3)$$

(where dFh_target is a target value of the frequency change amount of the specified signal due to a large change in the sampling frequency, which target value is an arbitrary frequency determined within a range of 0 to dFs/2, n is the sample number calculated by Equation (1), dn is the change amount of the sample number n due to a large change of the sampling frequency, and a large change amount dFs of the sampling frequency is determined within a range capable of being established in a range of a frequency fluctuation estimated to be contained in the measured signal), and when the frequency change amount dFh_meas of the specified signal is expressed by Equation (4):

$$dFh\_meas=dn\cdot(Fs+dFs)+(n+en)\cdot dFs \quad (4)$$

(where en is the error contained in the sample number n), the error en contained in the sample number n is calculated from Equation (5) obtained by taking the difference between Equations (3) and (4):

$$en=(dFh\_meas-dFh\_target)/dFs \quad (5).$$

5. The measured-signal repetition frequency detection method according to claim 4, wherein the sixth stage is such that an accurate sample number n+en is obtained by adding the error en contained in the sample number n calculated in the fifth stage to the sample number n calculated in the third stage, the accurate sample number n+en is reflected in the Equation (2) as ΔFh/ΔFs indicating the sample number, and thereby correcting the provisional repetition frequency Fx' of the measured signal calculated by the Equation (2), the regular repetition frequency Fx of the measured signal is calculated.

6. A measured-signal sampling apparatus comprising:

an input terminal to input a measured signal;

a signal generating unit which selectively generates a clock signal of first to third sampling frequencies in accordance with a designation;

a sampling pulse generating unit which selectively generates, as the first to third sampling frequencies synchronized with the clock signal from the signal generating unit and in accordance with the designation, a first sampling pulse having a provisional sampling frequency Fs, a second sampling pulse having a sampling frequency changed by a minuscule frequency ΔFs not generating a frequency fold from the provisional sampling frequency Fs at a time of sampling, and a third sampling pulse having a sampling frequency changed from the provisional sampling frequency Fs by a large frequency dFs to generate the frequency fold at a time of sampling;

a sampling unit which selectively samples the measured signal with the first to third sampling pulses from the sampling pulse generating unit;

a specified signal frequency detector which detects a frequency Fh of the specified signal appearing in a band not more than one half of the provisional sampling frequency Fs among signals obtained in a case where the measured signal is sampled by the sampling unit with the first sampling pulse from the sampling pulse generating unit;

a frequency change amount calculation unit which calculates a frequency change amount ΔFh of the specified signal detected by the specified signal frequency detector at a time of sampling the measured signal by the sampling unit with the second sampling pulse from the sampling pulse generating unit;

a provisional repetition frequency calculation unit which calculates a provisional repetition frequency Fx' of the measured signal based on the provisional sampling frequency Fs generated by the sampling pulse generating unit, the minuscule frequency ΔFs as a change amount of the sampling frequency, the frequency Fh of the specified signal for the provisional sampling frequency Fs detected by the specified signal frequency detector and the frequency change amount ΔFh of the specified signal calculated by the frequency change amount calculation unit;

a sample number calculation unit which calculates a sample number n from Equation (1) below:

$$n=\Delta Fh/\Delta Fs \quad (1)$$

where a denominator is the minuscule frequency ΔFs used in the provisional repetition frequency calculation unit and a numerator is the frequency change amount ΔFh used in the provisional repetition frequency calculation unit;

a specified signal frequency change amount detector which detects a frequency change amount dFh of the specified signal obtained in a case where the measured signal is sampled by the sampling unit with the third sampling pulse from the sampling pulse generating unit;

a sample number error calculation unit which calculates an error en contained in the sample number n calculated by the sample number calculation unit with a frequency fluctuation contained in the measured signal, based on the frequency change amount dFh of the specified signal detected by the specified signal frequency change amount detector and a change amount dn of the sample number n calculated by the sample number calculation unit indicating how many times the frequency fold has occurred in this process; and a regular repetition frequency calculation unit which calculates a regular repetition frequency Fx of the measured signal by correcting the provisional repetition frequency Fx' of the measured signal calculated by the provisional repetition frequency calculation unit based on the error en contained in the sample number n calculated by the sample number error calculation unit.

7. The measured-signal sampling apparatus according to claim 6, wherein the specified signal frequency detector causes to generate the first sampling pulse having the provisional sampling frequency from the sampling pulse generating unit by designating, for the signal generating unit, the provisional sampling frequency having a given repetition frequency Fs as the first sampling frequency in accordance with the designation and detects the frequency Fh of the specified signal appearing in a band Fs/2 not more than one half of the given repetition frequency Fs among the signals obtained in the case where the measured signal is sampled by the sampling unit with the first sampling pulse having the provisional sampling frequency.

8. The measured-signal sampling apparatus according to claim 7,
wherein the frequency change amount calculation unit causes to generate the second sampling pulse from the sampling pulse generating unit by designating, for the signal generating unit, the sampling frequency having the frequency changed from the given repetition frequency Fs by a minuscule frequency ΔFs not generating the frequency fold at a time of sampling as the second sampling frequency in accordance with the designation and calculates the frequency change amount ΔFh of the specified signal obtained in a case where the measured signal is sampled by the sampling unit with the second sampling pulse.

9. The measured-signal sampling apparatus according to claim 8,
wherein the provisional repetition frequency calculation unit calculates the provisional repetition frequency Fx' of the measured signal from Equation (2) below:

$$Fx'=Fh-Fs \cdot \Delta Fh/\Delta Fs \ldots \text{(in the case where } 0>\Delta Fh/\Delta Fs)$$

$$Fx'=-Fh+Fs \cdot \Delta Fh/\Delta Fs \ldots \text{(in the case where } 0<\Delta Fh/\Delta Fs) \quad (2)$$

based on the provisional sampling frequency Fs from the sampling pulse generating unit, the minuscule frequency ΔFs as a change amount of the sampling frequency, the frequency Fh of the specified signal for the provisional sampling frequency detected by the specified signal frequency detector and the frequency change amount ΔFh of the specified signal calculated by the frequency change amount calculation unit.

10. The measured-signal sampling apparatus according to claim 9,
wherein the specified signal frequency change amount detector causes to generate the third sampling pulse from the sampling pulse generating unit by designating, for the signal generating unit, the sampling frequency having a frequency changed from the given repetition frequency Fs by a large change amount dFs to generate the frequency fold at the time of sampling as the third sampling frequency in accordance with the designation and detects the frequency change amount dFh_meas of the specified signal obtained in a case where the measured signal is sampled with the third sampling pulse by the sampling unit, thereby calculating the change amount dn of the sample number n from Equation (3):

$$dFh\_target = dn \cdot (Fs+dFs) + n \cdot dFs \quad (3)$$

(where dFh_target is a target value of the frequency change amount of the specified signal due to the large change in the sampling frequency and an arbitrary frequency determined within a range of 0 to dFs/2, n is the sample number calculated by the sample number calculation unit, dn is the change amount of the sample number n due to a large change in the sample frequency, and the large change amount dFs of the sampling frequency is determined in such a manner as to be established within a range of frequency fluctuation estimated to be contained in the measured signal).

11. The measured-signal sampling apparatus according to claim 10,
wherein the sample number error calculation unit, when the frequency change amount dFh_meas of the specified signal detected by the specified signal frequency change amount detector is expressed by Equation (4):

$$dFh\_meas = dn \cdot (Fs+dFs) + (n+en) \cdot dFs \quad (4)$$

(where en is the error contained in the sample number n), calculates the error en contained in the sample number n according to Equation (5) obtained by taking the difference between Equations (3) and (4):

$$en = (dFh\_meas - dFh\_target)/dFs \quad (5).$$

12. The measured-signal sampling apparatus according to claim 11,
wherein the regular repetition frequency calculation unit adds the error en contained in the sample number n calculated by the sample number error calculation unit to the sample number n calculated by the sample number calculation unit thereby to acquire an accurate sample number n+en, which is reflected in the Equation (2) as ΔFh/ΔFs indicating the sample number n calculated by the sample number calculation unit, thereby calculating the regular repetition frequency Fx of the measured signal by correcting the provisional repetition frequency Fx' of the measured signal calculated according to the Equation (2).

13. The measured-signal sampling apparatus according to claim 12,
further comprising an arithmetic unit which calculates, as the regular sampling frequency for the measured signal, a frequency Fs corresponding to a period Ts different by a predetermined offset delay time ΔT from an integer multiple of a repetition period Tx corresponding to the regular repetition frequency Fx calculated by the regular repetition frequency calculation unit, and by designating this calculated regular sampling frequency for the signal generating unit, causes the sampling pulse generating unit to generate a sampling pulse having the regular sampling frequency in place of the first to third sampling pulses, and permits the sampling unit to sample the measured signal with the sampling pulse having the regular sampling frequency.

14. The measured-signal sampling apparatus according to claim 13,
further comprising:
a clock output terminal which outputs the clock signal from the signal generating unit to an external unit; and
a sample signal output terminal which outputs the signal from the sampling unit to an external unit.

15. A measured-signal waveform observation system comprising:
an input terminal to input a measured signal;
a signal generating unit which selectively generates a clock signal of first to third sampling frequencies in accordance with a designation and a fourth sampling frequency in accordance with a designation;
a sampling pulse generating unit which selectively generates, as the first to third sampling frequencies synchronized with the clock signal from the signal generating unit and in accordance with the designation, a first sampling pulse having a provisional sampling frequency Fs, a second sampling pulse having a sampling frequency changed from the provisional sampling frequency Fs by a minuscule frequency ΔFs not generating a frequency fold at a time of sampling, a third sampling pulse having a sampling frequency changed from the provisional sampling frequency Fs largely to generate the frequency fold at a time of sampling and a fourth sampling pulse having a fourth sampling frequency in accordance with the designation;

a sampling unit which selectively samples the measured signal with the first to third sampling pulses and the fourth sampling pulse from the sampling pulse generating unit;

a specified signal frequency detector which detects a frequency Fh of the specified signal appearing in a band not more than one half of the provisional sampling frequency Fs among signals obtained in a case where the measured signal is sampled by the sampling unit with the first sampling pulse from the sampling pulse generating unit;

a frequency change amount calculation unit which calculates a frequency change amount ΔFh of the specified signal obtained at a time of sampling the measured signal by the sampling unit with the second sampling pulse from the sampling pulse generating unit;

a provisional repetition frequency calculation unit which calculates a provisional repetition frequency Fx' of the measured signal, based on the provisional sampling frequency Fs generated by the sampling pulse generating unit, the minuscule frequency ΔFs as a change amount of the sampling frequency, the frequency Fh of the specified signal for the provisional sampling frequency Fs detected by the specified signal frequency detector and the frequency change amount ΔFh of the specified signal calculated by the frequency change amount calculation unit;

a sample number calculation unit which calculates a sample number n from Equation (1) below:

$$n = \Delta Fh / \Delta Fs \quad (1)$$

where a denominator is the minuscule frequency ΔFs used in the provisional repetition frequency calculation unit and a numerator is the frequency change amount ΔFh used in the provisional repetition frequency calculation unit;

a specified signal frequency change amount detector which detects a frequency change amount dFh_meas of the specified signal obtained in a case where the measured signal is sampled by the sampling unit with the third sampling pulse from the sampling pulse generating unit;

a sample number error calculation unit which calculates an error en contained in the sample number n calculated by the sample number calculation unit with a frequency fluctuation contained in the measured signal, based on the frequency change amount dFh_meas of the specified signal detected by the specified signal frequency change amount detector and a change amount dn of the sample number n calculated by the sample number calculation unit indicating how many times the frequency fold has occurred in this process;

a regular repetition frequency calculation unit which calculates a regular repetition frequency Fx of the measured signal by correcting the provisional repetition frequency Fx' of the measured signal calculated by the provisional repetition frequency calculation unit based on the error en contained in the sample number n calculated by the sample number error calculation unit;

an arithmetic unit which calculates, as a regular sampling frequency for the measured signal, the frequency Fs corresponding to a period Ts different by a predetermined offset delay time ΔT from an integer multiple of a repetition period Tx corresponding to the regular repetition frequency Fx calculated by the regular repetition frequency calculation unit, and by designating this calculated regular sampling frequency as the fourth sampling frequency for the signal generating unit, causes to generate the fourth sampling pulse from the sampling pulse generating unit and causes the sampling unit to sample the measured signal with the fourth sampling pulse;

an analog/digital (A/D) converter which converts a signal sampled with the fourth sampling pulse by the sampling unit into digital waveform data, and outputs the waveform data;

a waveform data memory which stores the waveform data output from the A/D converter;

a data acquisition control unit which writes the waveform data output from the A/D converter into the waveform data memory in synchronism with the clock signal from the signal generating unit; and a display control unit which reads a series of waveform data stored in the waveform data memory and displays the waveform data at intervals corresponding to the offset delay time on a time axis of a display unit.

16. The measured-signal waveform observation system according to claim 15, wherein the specified signal frequency detector, by designating a provisional sampling frequency having a given repetition frequency Fs for the signal generating unit as a first sampling frequency in accordance with the designation, causes the sampling pulse generating unit to generate the first sampling pulse having the provisional sampling frequency and detects the frequency Fh of the specified signal appearing in a band Fs/2 not more than one half of the given repetition frequency Fs among signals obtained in a case where the measured signal is sampled by the sampling unit with the first sampling pulse having the provisional sampling frequency.

17. The measured-signal waveform observation system according to claim 16, wherein the frequency change amount calculation unit, by designating the sampling frequency having a frequency changed from the given repetition frequency Fs by a minuscule frequency ΔFs not generating the frequency fold at a time of sampling as the second sampling frequency in accordance with the designation for the signal generating unit, causes the sampling pulse generating unit to generate the second sampling pulse, and calculates the frequency change amount ΔFh of the specified signal obtained in a case where the measured signal is sampled by the sampling unit with the second sampling pulse.

18. The measured-signal waveform observation system according to claim 17, wherein the provisional repetition frequency calculation unit calculates the provisional repetition frequency Fx' of the measured signal from Equation (2) below:

$$Fx' = Fh - Fs \cdot \Delta Fh / \Delta Fs \ldots \text{(in the case where } 0 > \Delta Fh / \Delta Fs\text{)}$$

$$Fx' = -Fh + Fs \cdot \Delta Fh / \Delta Fs \ldots \text{(in the case where } 0 < \Delta Fh / \Delta Fs\text{)} \quad (2)$$

based on the provisional sampling frequency Fs from the sampling pulse generating unit, the minuscule frequency ΔFs as a change amount of the sampling frequency, the frequency Fh of the specified signal for the provisional sampling frequency Fs detected by the specified signal frequency detector and the frequency change amount ΔFh of the specified signal calculated by the frequency change amount calculation unit.

19. The measured-signal waveform observation system according to claim 18,
wherein the specified signal frequency change amount detector, by designating, for the signal generating unit, the sampling frequency having a frequency changed from the given repetition frequency Fs by a large frequency to generate the frequency fold at a time of sampling as the third sampling frequency in accordance with the designation, causes to generate the third sampling pulse from the sampling pulse generating unit and detects the frequency change amount dFh_meas of the specified signal obtained in a case where the measured signal is sampled by the sampling unit with the third sampling pulse, thereby calculating the change amount dn of the sample number n from Equation (3):

$$dFh\_target = dn \cdot (Fs + dFs) + n \cdot dFs \qquad (3)$$

(where dFh_target is a target value of the frequency change amount of the specified signal due to a large change in the sampling frequency and an arbitrary frequency determined within a range of 0 to dFs/2, n is the sample number calculated by the sample number calculation unit, dn is the change amount of the sample number n due to a large change in the sample frequency, and a large change amount dFs of the sampling frequency is determined within a range capable of being established in a range of a frequency fluctuation estimated to be contained in the measured signal).

20. The measured-signal waveform observation system according to claim 19,
wherein the sample number error calculation unit, when the frequency change amount dFh_meas of the specified signal detected by the specified signal frequency change amount detector is expressed by Equation (4):

$$dFh\_meas = dn \cdot (Fs + dFs) + (n + en) \cdot dFs \qquad (4)$$

(where en is the error contained in the sample number n), calculates the error en contained in the sample number n according to Equation (5) obtained by taking the difference between Equations (3) and (4):

$$en = (dFh\_meas - dFh\_target)/dFs \qquad (5).$$

21. The measured-signal waveform observation system according to claim 20,
wherein the regular repetition frequency calculation unit adds the error en contained in the sample number n calculated by the sample number error calculation unit to the sample number n calculated by the sample number calculation unit thereby to acquire an accurate sample number n+en, which is reflected in the Equation (2) as ΔFh/ΔFs indicating the sample number n calculated by the sample number calculation unit, and thereby correcting the provisional repetition frequency Fx' of the measured signal calculated in the Equation (2), the regular repetition frequency Fx of the measured signal is calculated.

22. The measured-signal waveform observation system according to claim 15,
wherein the specified signal frequency detector is configured to detect each of frequency of a plurality of specified signals appearing in a band not more than one half of the first sampling frequency,
the provisional repetition frequency calculation unit is configured to, based on the frequency change amount of the plurality of specified signals detected by the specified signal frequency detector, obtain a spectrum of a plurality of frequency components contained in the measured signal, and
the display control unit is configured to display the spectrum obtained by the provisional repetition frequency calculation unit on a frequency axis of the display unit through the regular repetition frequency calculation unit.

* * * * *